United States Patent
Morita et al.

(10) Patent No.: US 12,193,145 B2
(45) Date of Patent: Jan. 7, 2025

(54) SUBSTRATE FOR MOUNTING ELECTRONIC ELEMENT, ELECTRONIC DEVICE, AND ELECTRONIC MODULE PRELIMINARY CLASS

(71) Applicant: KYOCERA Corporation, Kyoto (JP)

(72) Inventors: Yukio Morita, Kyoto (JP); Noboru Kitazumi, Kyoto (JP); Yousuke Moriyama, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 18/157,176

(22) Filed: Jan. 20, 2023

(65) Prior Publication Data

US 2023/0156904 A1    May 18, 2023

Related U.S. Application Data

(63) Continuation of application No. 17/040,890, filed as application No. PCT/JP2019/013685 on Mar. 28, 2019, now Pat. No. 11,570,882.

(30) Foreign Application Priority Data

Mar. 28, 2018 (JP) .................................. 2018-062279
May 28, 2018 (JP) .................................. 2018-101617

(51) Int. Cl.
*H05K 1/02* (2006.01)
*H05K 1/11* (2006.01)
(Continued)

(52) U.S. Cl.
CPC ............. *H05K 1/0204* (2013.01); *H05K 1/11* (2013.01); *H05K 1/141* (2013.01); *H05K 1/181* (2013.01);
(Continued)

(58) Field of Classification Search
CPC ........ H05K 1/0204; H05K 1/11; H05K 1/141; H05K 1/181; H05K 1/0206; H05K 1/0209;
(Continued)

(56) References Cited

U.S. PATENT DOCUMENTS 4,902,358 A * 2/1990 Napier .................. C04B 37/026
                                                           148/528
5,807,626 A * 9/1998 Naba .................. B23K 35/3006
                                                           428/673
(Continued)

FOREIGN PATENT DOCUMENTS

JP     2011-159662 A    8/2011
JP     2013-175508 A    9/2013
(Continued)

*Primary Examiner* — Ishwarbhai B Patel
(74) *Attorney, Agent, or Firm* — Volpe Koenig

(57) ABSTRACT

A substrate for mounting electronic element includes: a first substrate including a first surface and a second surface opposite to the first surface; a second substrate including a third surface and a fourth surface opposite to the third surface; and heat dissipation bodies each including a fifth surface and a sixth surface opposite to the fifth surface. The first substrate includes at least one mounting portion for at least one electronic element at the first surface. Heat conduction of the heat dissipation bodies in a direction perpendicular to a longitudinal direction of the at least one mounting portion and perpendicular to a direction along opposite sides of the second substrate is greater than heat conduction of the heat dissipation bodies in the longitudinal direction of the at least one mounting portion and in the direction along opposite sides of the second substrate in a transparent plan view of the substrate.

11 Claims, 24 Drawing Sheets

(51) Int. Cl.
  *H05K 1/14*  (2006.01)
  *H05K 1/18*  (2006.01)
  *H05K 1/03*  (2006.01)
(52) U.S. Cl.
  CPC ......... *H05K 1/0206* (2013.01); *H05K 1/0209* (2013.01); *H05K 1/0306* (2013.01); *H05K 2201/0323* (2013.01)
(58) Field of Classification Search
  CPC ......... H05K 1/0306; H05K 2201/0323; H05K 2201/041; H05K 3/0061; H05K 3/4608; H05K 2201/10106; H05K 2201/10121; H05K 2201/10151; H01L 33/62; H01L 33/641; H01L 25/0753; H01L 23/3677; H01L 33/642; H01S 5/02469; H01S 5/02476; H01S 5/4025
  See application file for complete search history.

(56) References Cited

U.S. PATENT DOCUMENTS

| | | | |
|---|---|---|---|
| 5,958,572 A | 9/1999 | Schmidt et al. | |
| 8,164,000 B2* | 4/2012 | Yeh | H05K 1/056 174/254 |
| 8,969,154 B2* | 3/2015 | Sandhu | H01L 21/823437 438/212 |
| 2007/0198096 A1* | 8/2007 | Wort | A61F 2/32 623/19.12 |
| 2007/0231560 A1* | 10/2007 | Zhang | F28F 13/00 428/323 |
| 2008/0180014 A1 | 7/2008 | Tzeng et al. | |
| 2009/0039500 A1* | 2/2009 | Ito | H01L 23/3735 257/E23.101 |
| 2009/0168354 A1* | 7/2009 | Jewram | H01L 24/83 361/709 |
| 2012/0279760 A1 | 11/2012 | Sun | |
| 2013/0344611 A1* | 12/2013 | Lee | B82Y 40/00 428/457 |
| 2014/0144677 A1 | 5/2014 | Wang et al. | |
| 2014/0355215 A1 | 12/2014 | Canete et al. | |
| 2016/0143129 A1 | 5/2016 | Min et al. | |
| 2016/0249445 A1 | 8/2016 | Min et al. | |
| 2016/0268189 A1 | 9/2016 | Mikado et al. | |

FOREIGN PATENT DOCUMENTS

| | | |
|---|---|---|
| JP | 2015-191950 A | 11/2015 |
| JP | 2016-157928 A | 9/2016 |
| JP | 2017-139325 A | 8/2017 |
| JP | 2017-204503 A | 11/2017 |
| JP | 2018-152408 A | 9/2018 |

* cited by examiner

SUBSTRATE FOR MOUNTING ELECTRONIC ELEMENT, ELECTRONIC DEVICE, AND ELECTRONIC MODULE PRELIMINARY CLASS

CROSS-REFERENCE TO RELATED APPLICATIONS

This application is a continuation application of U.S. patent application Ser. No. 17/040,890 filed on Sep. 23, 2020, which issued as U.S. Pat. No. 11,570,882 on Jan. 31, 2023, which is a National Phase entry according to 35 U.S.C. 371 of International Application No. PCT/JP2019/013685 filed on Mar. 28, 2019, which claims priority to Japanese Patent Application Nos. 2018-062279 filed on Mar. 28, 2018, and 2018-101617 filed on May 28, 2018, the contents of which are entirely incorporated herein by reference.

TECHNICAL FIELD

The present disclosure relates to a substrate for mounting electronic element, an electronic device, and an electronic module.

BACKGROUND OF THE INVENTION

A substrate for mounting electronic element of the related art includes an insulating substrate including a first surface, a second surface, and side surfaces, an electronic element mounting portion and a wiring layer which are disposed on the first surface of the insulating substrate. After mounting electronic element on the electronic element mounting portion, the substrate for mounting electronic element is mounted in a package for mounting electronic element to obtain an electronic device (see Japanese Unexamined Patent Publication JP-A 2013-175508).

SUMMARY OF THE INVENTION

A substrate for mounting electronic element according to the disclosure includes a first substrate including a first surface and a second surface opposite to the first surface, a second substrate including a third surface and a fourth surface opposite to the third surface, and a plurality of heat dissipation bodies each including a fifth surfaces and a sixth surface opposite to the fifth surface, the first substrate including at least one mounting portion for at least one electronic element at the first surface, and the at least one mounting portion being a rectangular shape, the second substrate being made of metal, having a quadrangular shape, the plurality of heat dissipation bodies being made of a carbon material, and the fifth surface being connected to at least the second surface at location overlapped with the at least one mounting portion in a transparent plan view, heat conduction of the plurality of heat dissipation bodies in a direction perpendicular to a longitudinal direction of the at least one mounting portion and perpendicular to a direction along opposite sides of the second substrate being larger than heat conduction of the plurality of heat dissipation bodies in the longitudinal direction of the at least one mounting portion and in the direction along opposite sides of the second substrate in a transparent plan view of the substrate for mounting electronic element.

An electronic device of the disclosure includes the substrate for mounting electronic element described above, at least one electronic element mounted on the at least one mounting portion of the substrate for mounting electronic element, and a wiring substrate or a package for housing an electronic element on which the substrate for mounting electronic element is to be mounted.

An electronic module of the disclosure includes the electronic device described above and a module substrate to which the electronic device is to be connected.

DETAILED DESCRIPTION

Figure 1A:
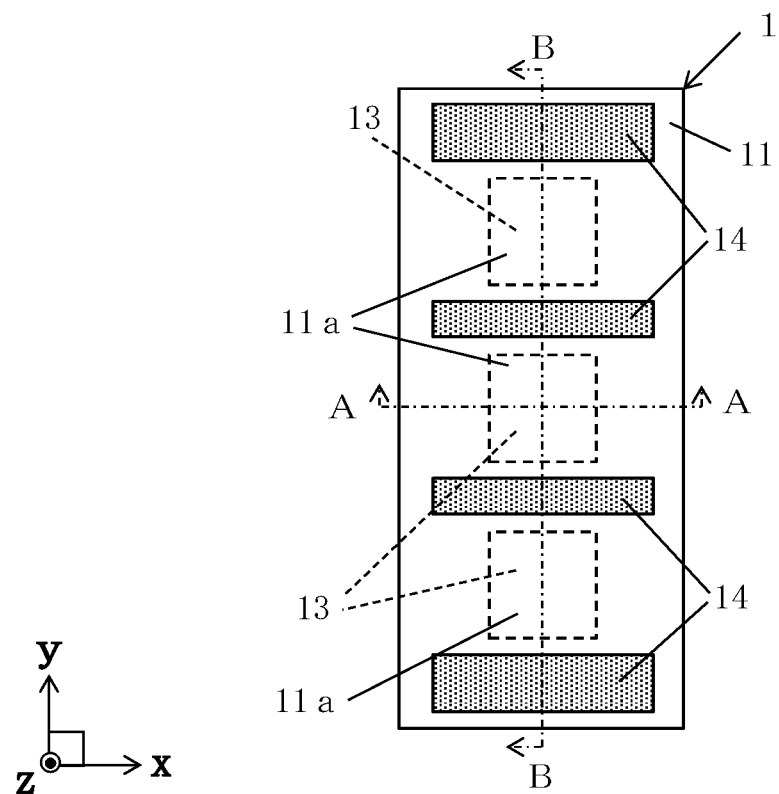
FIG. 1A is a top view illustrating a substrate for mounting electronic element according to a first embodiment.

Several exemplary embodiments of the disclosure will be described with reference to the accompanying drawings.

First Embodiment

A substrate for mounting electronic element 1 according to a first embodiment includes a first substrate 11, a second substrate 12, and heat dissipation bodies 13 as in the example shown in FIGS. 1A to 4B. The electronic device includes the substrate for mounting electronic element 1, an electronic element 2 mounted on a mounting portion 11a of the substrate for mounting electronic element 1, and a wiring substrate 4 on which the substrate for mounting electronic element 1 is to be mounted. The electronic device is connected to a connection pad 6a located on a module substrate 6 which constitutes the electronic module, for example, by using a bonding material 7.

Figure 4A:
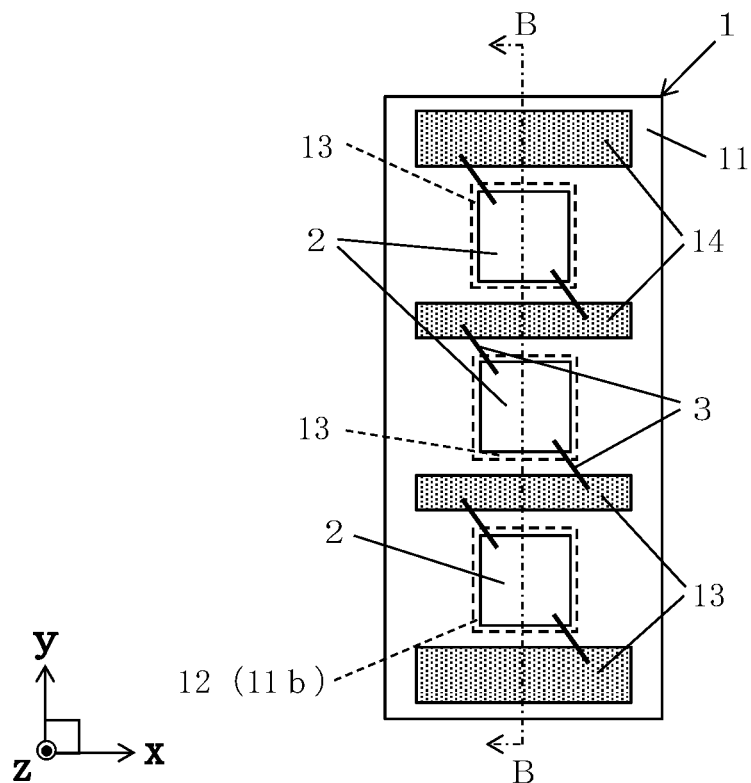
FIG. 4A is a top view illustrating a state in which an electronic element is mounted on the substrate for mounting electronic element illustrated in FIG. 1A.
Figure 4B:
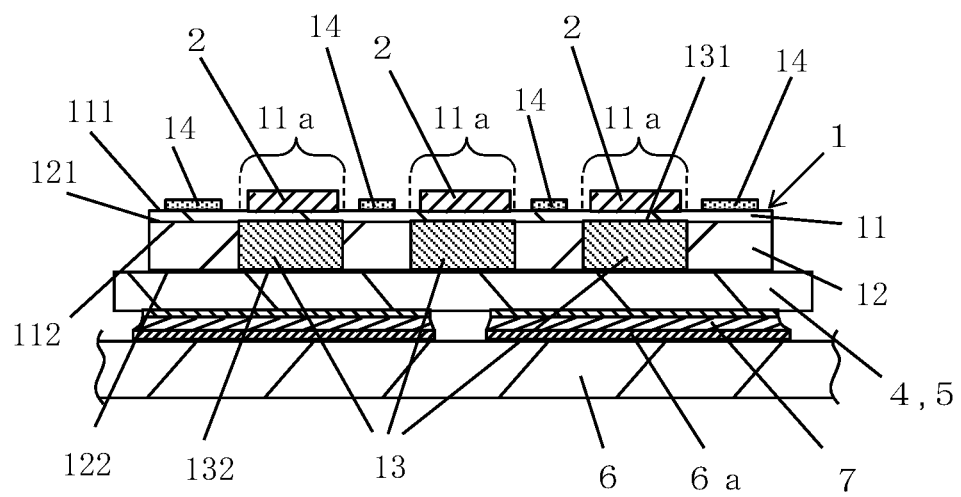
FIG. 4B is a vertical cross-sectional view of a structure including a wiring substrate or a package for housing electronic element and a module substrate, taken along the line B-B of FIG. 4A.
Figure 4B:
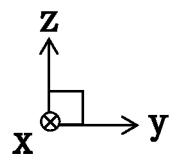

The substrate for mounting electronic element 1 according to the embodiment includes the first substrate 11 including a first surface 111 and a second surface 112 opposite to the first surface 111, the second substrate 12 including a third surface 121 and a fourth surface 122 opposite to the third surface 121, and the plurality of heat dissipation bodies 13 each including a fifth surface 131 and a sixth surface 132 opposite to the fifth surface 131. The first substrate 11 includes at least one mounting portion 11a for at least one electronic element 2 at the first surface 111, and the at least one mounting portion 11a is a rectangular shape, the second substrate 12 is made of metal, and has a quadrangular shape, the plurality of heat dissipation bodies 13 is made of a carbon material, and the fifth surface 131 is connected to at least the second surface 112 at location overlapped with the at least one mounting portion 11a in a transparent plan view. The heat conduction of the plurality of heat dissipation bodies 13 in a direction perpendicular to a longitudinal direction of the at least one mounting portion 11a and perpendicular to a direction along opposite sides of the second substrate 12 is larger than the heat conduction of the plurality of heat dissipation bodies 13 in the longitudinal direction of the at least one mounting portion 11a and in the direction along the opposite sides of the second substrate 12 in a transparent plan view. The first substrate 11 includes a metal layer 14 on a surface thereof. In FIGS. 4A and 4B, the electronic element 2 is mounted on an xy plane in a virtual xyz space. In FIGS. 1A to 4B, an upward direction means a positive direction of a virtual z axis. The distinction between upper and lower sides in the following description is for convenience and does not limit the upper and lower sides when the substrate for mounting electronic element 1 or the like is actually used.

Figure 1B:
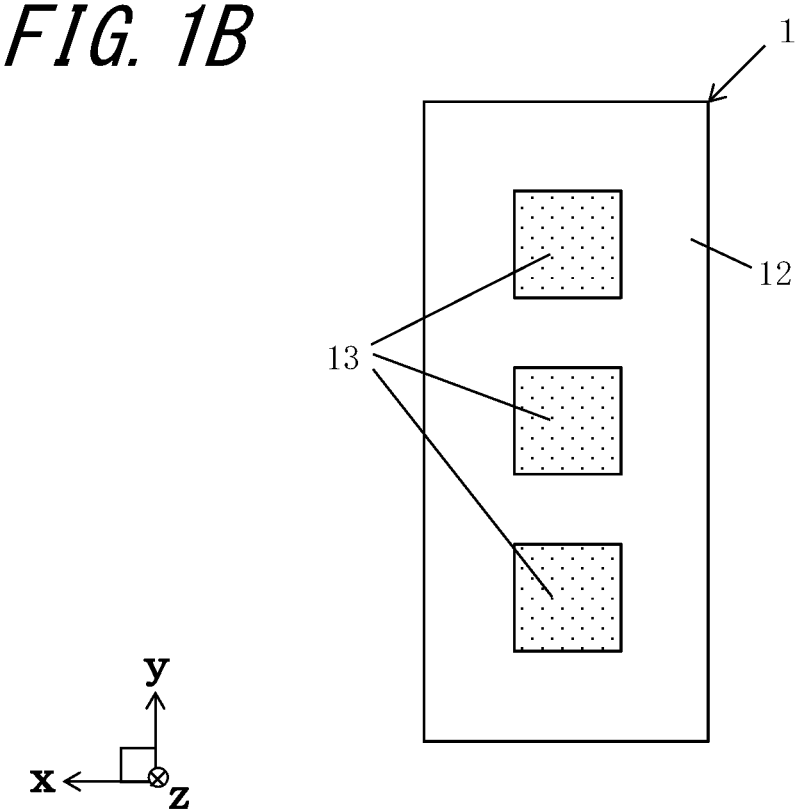
FIG. 1B is a bottom view of FIG. 1A.

In the example illustrated in FIGS. 1A and 1B, in the substrate for mounting electronic element 1, the three heat dissipation bodies 13 are located in series in through holes 12a of the second substrate 12, and the four metal layers 14 are located on the first surface 111 of the first substrate 11.

Figure 2:
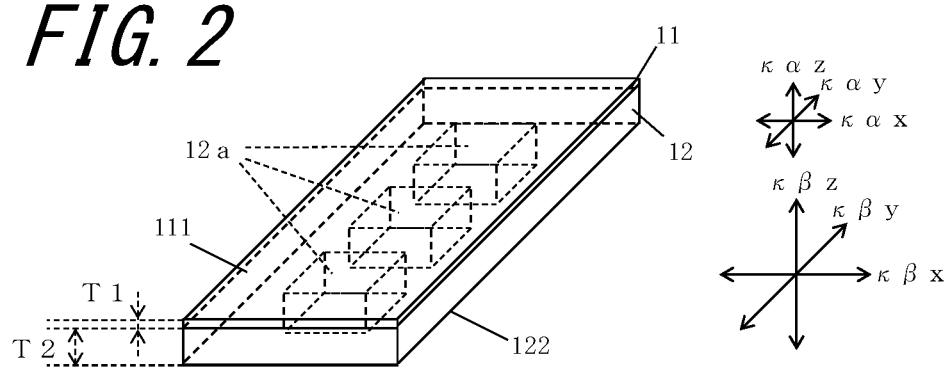
FIG. 2 is an exploded perspective view of a first substrate, a second substrate, and a heat dissipation body of the substrate for mounting electronic element illustrated in FIGS. 1A and 1B.
Figure 2:
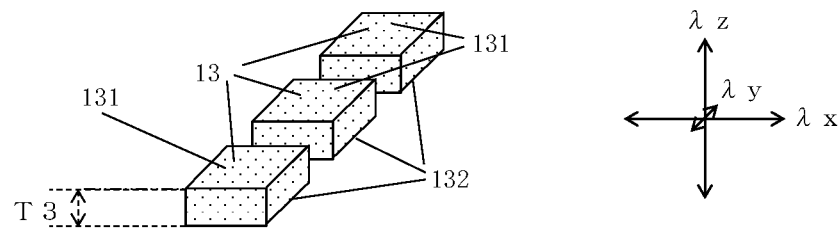
Figure 2:
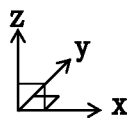
Figure 3A:
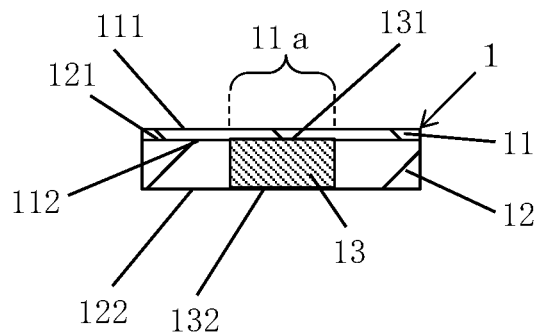
FIG. 3A is a vertical cross-sectional view of the substrate for mounting electronic element taken along the line A-A of FIG. 1A.
Figure 3A:
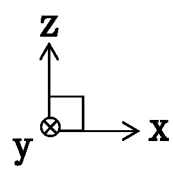
Figure 3B:
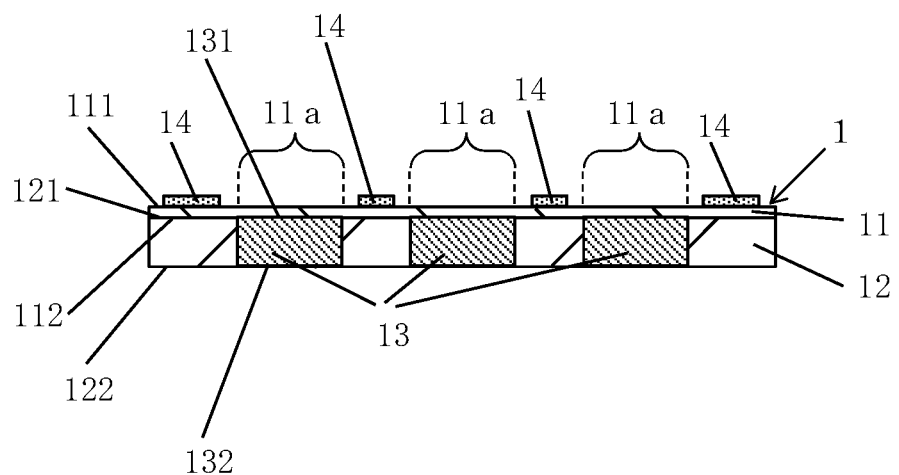
FIG. 3B is a vertical cross-sectional view of the substrate for mounting electronic element taken along the line B-B of FIG. 1A.
Figure 3B:
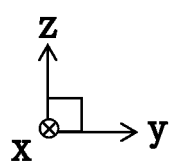

The plurality of heat dissipation bodies 13 are shaded in the examples illustrated in FIGS. 1B and 2. The metal layers 14 are shaded in the examples illustrated in FIGS. 1A, 3B, 4A and 4B. In the example illustrated in FIGS. 1A, 1B and 4A, a region overlapping with the outer surfaces of the plurality of heat dissipation bodies 13 of the first substrate 11 in a transparent plan view is shown by a broken line. In the example illustrated in FIG. 2, in the first substrate 11, the outer surface of the first substrate 11 which is invisible in a perspective view is shown by a broken line. In the example illustrated in FIG. 2, in the second substrate 12, the outer surface of the second substrate 12 and the inner surface of the through hole 12a, which are invisible in a perspective view, are shown by broken lines. The mounting portion 11a of the electronic element 2 is arranged so as to overlap with the heat dissipation bodies 13 if seen in a transparent plan view.

The first substrate 11 is comprised of a single layer or a plurality of insulating layers and includes the first surface 111 (an upper surface in FIGS. 1A to 4B) and the second surface 112 (a lower surface in FIGS. 1A to 4B. The first substrate 11 is comprised of a single insulating layer in the example illustrated in FIGS. 1A to 4B. The first substrate 11 has a rectangular plate-like shape including two sets of opposite sides (4 sides) with respect to each of the first surface 111 and the second surface 112 in a plan view. In the examples illustrated in FIGS. 1A to 4B, the first substrate 11 has a rectangular shape which is long in a direction of arrangement (arrangement of the plurality of mounting portions 11a) of the plurality of electronic elements 2 in a plan view. The first substrate 11 functions as a support for supporting the plurality of electronic elements 2 and the plurality of electronic elements 2 are adhered and fixed on the plurality of mounting portions 11a located on the first surface 111 of the first substrate 11 via bonding members. The first surface 111 includes the at least one mounting portion 11a for the at least one electronic element 2 which is a longitudinal region, and in the example illustrated in FIGS. 1A to 4B, the plurality of mounting portions 11a are provided.

As the first substrate 11, for example, ceramics such as an aluminum oxide sintered body (alumina ceramics), an aluminum nitride sintered body, a mullite sintered body, or a glass ceramic sintered body can be used. If the first substrate 11 is made of, for example, an aluminum nitride sintered body, a raw material powder such as aluminum nitride (AlN), erbium oxide ($Er_2O_3$), and yttrium oxide ($Y_2O_3$) is mixed with an appropriate organic binder and solvent or the like to prepare a slurry. A ceramic green sheet is produced by forming this slurry into a sheet shape by employing a well-known doctor blade method, calendar roll method, or otherwise. If necessary, a plurality of ceramic green sheets are laminated and the ceramic green sheets are fired at a high temperature (about 1800° C.) to manufacture the first substrate 11 including a single layer or a plurality of insulating layers.

The second substrate 12 includes the third surface 121 (an upper surface in FIGS. 1A to 3B) and the fourth surface 122 (a lower surface in FIGS. 1A to 3B). The third surface 121 and the fourth surface 122 are located opposite to each other. The second substrate 12 has a quadrangular plate-like shape including two sets of opposing sides (4 sides) with respect to each of the third surface 121 and the fourth surface 122 in a plan view.

For the second substrate 12, for example, a metal material such as copper (Cu), copper-tungsten (Cu—W), and copper-molybdenum (Cu—Mo) can be used. The second substrate 12 includes the through hole 12a which passes from the third surface 121 to the fourth surface 122. The through holes 12a are areas where the plurality of heat dissipation bodies 13 are located.

The plurality of heat dissipation bodies 13 each include the fifth surface 131 (an upper surface in FIGS. 1A to 3B) and the sixth surface 132 (a lower surface in FIGS. 1A to 3B). The fifth surface 131 and the sixth surface 132 are located opposite to each other. The plurality of heat dissipation bodies 13 have a quadrangular plate-like shape including two sets of opposing sides (4 sides) with respect to each of the fifth surface 131 and the sixth surface 132 in a plan view.

The plurality of heat dissipation bodies 13 are made of, for example, a carbon material and are formed as a structure in which graphenes in which six-membered rings are covalently connected are stacked. This structure is constituted by a material in which each surface is joined by Van der Waals forces.

The plurality of heat dissipation bodies 13 are located in the through holes 12a of the second substrate 12 as in the example illustrated in FIGS. 1A to 4B. The fifth surfaces 131 of the plurality of heat dissipation bodies 13 are located on the third surface side 121 of the second substrate 12, and the sixth surfaces 132 of the plurality of heat dissipation bodies 13 are located on the fourth surface 122 side.

As the first substrate 11, an aluminum nitride sintered body having excellent thermal conductivity is preferably used. As the second substrate 12, a substrate made of Cu having an excellent thermal conductivity is preferably used. In the second substrate 12 and the plurality of heat dissipation bodies 13, the inner surface of the through hole 12a of the second substrate 12 and the outer surfaces of the plurality of heat dissipation bodies 13 are bonded by, for example, a bonding material made of an active brazing material such as TiCuAg alloy or TiSnAgCu alloy. The bonding material is arranged between the second substrate 12 and the plurality of heat dissipation bodies 13 in a thickness of about 10 μm.

In the first substrate 11 and the second substrate 12, the second surface 112 of the first substrate 11 and the third surface 121 of the second substrate 12 are bonded by, for example, a bonding material made of an active brazing material such as TiCuAg alloy or TiSnAgCu. Further, in the first substrate 11 and the plurality of heat dissipation bodies 13, the second surface 112 of the first substrate 11 and the fifth surface 131 of the plurality of heat dissipation bodies 13 are bonded by, for example, a bonding material made of an active brazing material such as TiCuAg alloy or TiSnAgCu. The bonding material with a thickness of about 10 μm is arranged between the first substrate 11 and the second substrate 12 and between the first substrate 11 and the plurality of heat dissipation bodies 13.

The first substrate 11, the second substrate 12, and the plurality of heat dissipation bodies 13 may be simultaneously joined. For example, the plurality of heat dissipation bodies 13 may be located in the through holes 12a of the second substrate 12 and the first substrate 11 may be joined to the second substrate 12 and the plurality of heat dissipation bodies 13. In this case, for example, by joining while applying pressure from the first surface 111 side of the first substrate 11 and the fourth surface 122 side of the second substrate 12, the first substrate 11, the second substrate 12, and the plurality of heat dissipation bodies 13 are well joined and the substrate for mounting electronic element 1 having excellent reliability can be obtained.

The first substrate 11 has a quadrangular shape in a plan view as in the example illustrated in FIGS. 1A to 4B. The second substrate 12 has a quadrangular shape in a plan view as in the example illustrated in FIGS. 1A to 4B. The plurality of heat dissipation bodies 13 have a quadrangular shape in a plan view as in the example illustrated in FIGS. 1A to 4B. A quadrangular composite substrate is formed by bonding the first substrate 11 and the second substrate 12 together, and by bonding the first substrate 11 and the plurality of heat dissipation bodies 13 together. The quadrangular shape means a quadrangle such as a square and a rectangle. In the example illustrated in FIGS. 1A to 3B, in a plan view, the first substrate 11 and the second substrate 12 have a rectangular shape and the plurality of heat dissipation bodies 13 have a square shape. Therefore, the first substrate 11, the second substrate 12, and the plurality of heat dissipation bodies 13 form a rectangular composite substrate.

A substrate thickness T1 of the first substrate 11 is, for example, about 50 μm to 500 μm, and a substrate thickness T2 of the second substrate 12 is, for example, about 100 μm to 2000 μm. A substrate thickness T3 of the plurality of heat dissipation bodies 13 is, for example, about 100 μm to 2000 μm. The substrate thickness T2 of the second substrate 12 and the substrate thickness T3 of the plurality of heat dissipation bodies 13 are provided with the same thickness within a range of about 5% ($0.95T2 \leq T3 \leq 1.05T2$). If the first substrate 11 and the second substrate 12 are T2>T1 and the first substrate 11 and the plurality of heat dissipation bodies 13 are T3>T1, the heat of the first substrate 11 can be favorably radiated to the plurality of heat dissipation bodies 13.

As in the example illustrated in FIG. 2, a thermal conductivity $\kappa\alpha$ of the first substrate 11 is substantially constant in the x direction and the y direction in a planar direction, and the thermal conductivity in the z direction, which is the thickness direction, of the first substrate 11 is the same as the thermal conductivity in the x direction and the y direction in the planar direction ($\kappa\alpha x \approx \kappa\alpha y \approx \kappa\alpha z$). For example, if an aluminum nitride sintered body is used as the first substrate 11, the first substrate 11 is a substrate having a thermal conductivity $\kappa\alpha$ of about 100 to 200 W/m·K.

A thermal conductivity $\kappa\beta$ of the second substrate 12 is substantially constant in the x direction and the y direction in the planar direction, as in the example illustrated in FIG. 2, and the thermal conductivity in the z direction, which is the thickness direction, of the first substrate 11 is also the same as the thermal conductivity in the z direction and the y direction in the planar direction ($\kappa\beta x \approx \kappa\beta y \approx \kappa\beta z$). For example, if copper is used as the second substrate 12, the second substrate 12 is a substrate having a thermal conductivity $\kappa\beta$ of about 400 W/m·K.

A thermal conductivity $\lambda$ of the plurality of heat dissipation bodies 13 has different magnitudes in the x and y directions in the planar direction. The relationship between the thermal conductivity $\lambda x$, $\lambda y$, and $\lambda z$ in each direction of the plurality of heat dissipation bodies 13 illustrated in FIG. 2 satisfies "thermal conductivity $\lambda x \approx$ thermal conductivity $\lambda z >>$ thermal conductivity $\lambda y$". The thermal conductivities $\lambda$ of the plurality of heat dissipation bodies 13 in the x direction in the planar direction is the same as the thermal conductivities $\lambda$ of the plurality of heat dissipation bodies 13 in the z direction which is the thickness direction, and the thermal conductivities $\lambda$ of the plurality of heat dissipation bodies 13 in the y direction in the planar direction are different from each other. For example, the thermal conductivities $\lambda x$ and thermal conductivities $\lambda z$ of the plurality of heat dissipation bodies 13 are about 1000 W/m·K and the thermal conductivities $\lambda y$ of the plurality of heat dissipation bodies 13 are about 4 W/m·K.

The thermal conductivity of the substrate for mounting electronic element 1 according to the embodiment can be measured by an analysis method such as a laser flash method. Also, if measuring the thermal conductivity of the plurality of heat dissipation bodies 13, the bonding material which joins the first substrate 11 and the plurality of heat dissipation bodies 13 and the bonding material which joins the second substrate 12 and the plurality of heat dissipation bodies 13 are removed, and the measurement can be carried out on the plurality of heat dissipation bodies 13 by an analysis method such as laser flash method.

The thermal conductivity $\lambda x$ of the plurality of heat dissipation bodies 13 in the direction perpendicular to the longitudinal direction of the at least one mounting portion 11a and perpendicular to the direction along the opposite sides of the second substrate 12 is larger than the thermal conductivity $\lambda y$ of the plurality of heat dissipation bodies 13 in the longitudinal direction of the at least one mounting portion 11a and in the direction along the opposite sides of the second substrate 12. Also, the plurality of heat dissipation bodies 13 are arranged such that the thermal conductivity $\lambda z$ in the thickness direction of the plurality of heat dissipation bodies 13 is larger than the thermal conductivity $\lambda y$ in the longitudinal direction of the at least one mounting portion 11a and the direction along the opposite sides of the second substrate 12 (thermal conductivities $\lambda x$ and $\lambda z >>$ thermal conductivity $\lambda y$).

Further, the plurality of heat dissipation bodies 13 are arranged such that the thermal conductivity $\lambda y$ in the direction in which the plurality of heat dissipation bodies 13 are aligned, that is, in the direction between the at least one mounting portion 11a for the adjacent electronic elements 2, is smaller than the thermal conductivity $\lambda x$ in the direction perpendicular to the direction in which the plurality of heat dissipation bodies 13 are aligned and the thermal conductivity $\lambda z$ in the thickness direction of the plurality of heat dissipation bodies 13 (thermal conductivities $\lambda x$ and $\lambda z >>$ thermal conductivity $\lambda z$).

The metal layer 14 is located on the first surface 111 of the first substrate 11 around the plurality of heat dissipation bodies 13 in a plan view (a transparent plan view). Further, the metal layer 14 and the heat dissipation bodies 13 are alternately located in the longitudinal direction of the first substrate 11 in a plan view (a transparent plan view). The metal layer 14 is used, for example, as a connecting portion between an electrode of the electronic element 2 and a connecting member 3 such as a bonding wire. The metal layer 14 is a member for electrically connecting the electronic element 2 and the wiring conductor of the wiring substrate 4.

The metal layer 14 includes a thin film layer and a plating layer. The thin film layer has, for example, an adhesion metal layer and a barrier layer. The adhesion metal layer constituting the thin film layer is formed on the first surface 111 of the first substrate 11. The adhesion metal layer is made of, for example, tantalum nitride, nickel-chrome, nickel-chrome-silicon, tungsten-silicon, molybdenum-silicon, tungsten, molybdenum, titanium, chromium, or the like, and is deposited on the first surface 111 of the first substrate 11 by adopting a thin film forming technique such as a vapor deposition method, an ion plating method, or a sputtering method. For example, if forming using a vacuum deposition method, the first substrate 11 is installed in a film forming chamber of a vacuum evaporation system and a metal piece to be an adhesion metal layer is arranged at the evaporation source in the film forming chamber, and then, while the film forming chamber is in a vacuum state (pressure of $10^{-2}$ Pa or less), the metal piece placed in the vapor deposition source is heated for vapor deposition, and by depositing the molecules of the vapor-deposited metal piece on the first substrate 11, a thin film metal layer to be an adhesion metal layer is formed. Then, a resist pattern is formed on the first substrate 11 on which the thin film metal layer is formed by using a photolithography method, and then the excess thin film metal layer is removed by etching to form the adhesion metal layer. The barrier layer is deposited on the upper surface of the adhesion metal layer, and the barrier layer has good adhesiveness and wettability with the adhesion metal layer and the plating layer and has a function of firmly joining the adhesion metal layer and the plating layer and preventing mutual diffusion between the adhesion metal layer and the plating layer. The barrier layer is made of, for example, nickel-chromium, platinum, palladium, nickel, cobalt or the like, and is deposited on the surface of the adhesion metal layer by a thin film forming technique such as a vapor deposition method, an ion plating method, or a sputtering method.

The thickness of the adhesion metal layer is preferably about 0.01 μm to 0.5 μm. If the thickness of the adhesion metal layer is less than 0.01 μm, it tends to be difficult to firmly adhere the adhesion metal layer onto the first substrate 11. If thickness of the adhesion metal layer exceeds 0.5 µm, peeling of the adhesion metal layer is likely to occur due to internal stress during film formation of the adhesion metal layer. In addition, the thickness of the barrier layer is preferably about 0.05 µm to 1 µm. If the thickness of the barrier layer is less than 0.05 µm, defects such as pinholes tend to occur, and thus it is difficult to function as a barrier layer. If the thickness of the barrier layer exceeds 1 µm, peeling of the barrier layer is likely to occur due to internal stress during film formation.

The plating layer is deposited on the surface of the thin film layer by electrolytic plating or electroless plating. The plating layer is made of a metal having excellent corrosion resistance and connectivity with the connecting member, such as nickel, copper, gold, or silver, and for example, a nickel plating layer having a thickness of about 0.5 µm to 5 µm and a gold plating layer having a thickness of about 0.1 µm to 3 µm are sequentially deposited. As a result, corrosion of the metal layer 14 can be effectively suppressed and the metal layer 14 and the wiring conductor formed on the wiring substrate 4 can be firmly bonded.

Further, a metal layer such as copper (Cu) or gold (Au) may be arranged on the barrier layer so that the plating layer can be formed well. Such a metal layer is formed by a method similar to that of a thin film layer.

If forming the metal layer 14 on the first surface 111 of the first substrate 11 and forming the plating layer on the metal layer 14, if a protective film made of resin, ceramics, metals, or the like is provided on the exposed sixth surfaces 132 of the plurality of heat dissipation bodies 13 in advance, the plurality of heat dissipation bodies 13 made of carbon material are not exposed if manufacturing the substrate for mounting electronic element 1. Therefore, it is possible to reduce deterioration caused by chemicals or the like.

The electronic element 2 is mounted on the mounting portion 11a located on the first surface 111 side of the substrate for mounting electronic element 1 and the substrate for mounting electronic element 1 is mounted on the wiring substrate 4 or a package for housing electronic element 5, in such a manner that an electronic device can be manufactured. The electronic element 2 mounted on the substrate for mounting electronic element 1 is, for example, a light emitting element such as a Laser Diode (LD) or a Light Emitting Diode (LED) or a light receiving element such as a Photo Diode (PD). For example, after the electronic element 2 is fixed on the mounting portion 11a by a bonding material such as Au—Sn, the electrode of the electronic element 2 and the metal layer 14 are electrically connected via the connecting member 3 such as a bonding wire, in such a manner that the electronic element 2 is mounted on the substrate for mounting electronic element 1. For example, as similar to the first substrate 11, the wiring substrate 4 or the package for housing electronic element 5 on which the substrate for mounting electronic element 1 is to be mounted can use an insulating substrate such as ceramics and includes a wiring conductor on the surface thereof. Then, the metal layer 14 of the substrate for mounting electronic element 1 and the wiring substrate 4 or the wiring conductor of the package for housing electronic element 5 are electrically connected.

In accordance with the electronic device according to the embodiment, the substrate for mounting electronic element 1 including the above configuration, the electronic element 2 mounted on the mounting portion 11a of the substrate for mounting electronic element 1, and the wiring substrate 4 or the package for housing the electronic element 5 on which the substrate for mounting electronic element 1 is to be mounted are provided.

The electronic device according to the embodiment is connected to the wiring conductor and the connection pad 6a of the module substrate 6 via the bonding material 7 such as solder to form an electronic module.

According to the embodiment, the substrate for mounting electronic element includes the first substrate 11 including the first surface 111 and the second surface 112 opposite to the first surface 111, the second substrate 12 including the third surface 121 and the fourth surface 122 opposite to the third surface 121, and the plurality of heat dissipation bodies 13 each including the fifth surface 131 and the sixth surface 132 opposite to the fifth surface 131, the first substrate 11 including at least one mounting portion 11a for at least one electronic element 2 at the first surface 111, and the at least one mounting portion 11a being a rectangular shape, the second substrate 12 being made of metal, having a quadrangular shape, the plurality of heat dissipation bodies 13 being made of a carbon material, and the fifth surface 131 being connected to at least the second surface 112 at location overlapped with the at least one mounting portion 11a in a transparent plan view, the heat conduction of the plurality of heat dissipation bodies 13 in the direction perpendicular to the longitudinal direction of the at least one mounting portion 11a and perpendicular the direction along the opposite side of the second substrate 12 is larger than the heat conduction of the plurality of heat dissipation bodies 13 in the longitudinal direction of the at least one mounting portion 11a and in the direction along the opposite side to the second substrate 12 in a transparent plan view of the substrate for mounting electronic element 1. With the above configuration, for example, if the electronic device is operated, the heat generated from the electronic element 2 becomes large and evenly transmitted to the opposite sides of the second substrate 12 and heat dissipation of the substrate for mounting electronic element 1 becomes good. As a result, the distortion of the substrate for mounting electronic element 1 can be suppressed.

In addition, the plurality of heat dissipation bodies 13 are aligned inside the second substrate 12 and, in the transparent plan view, the plurality of heat dissipation bodies 13 have a greater heat conduction in the direction perpendicular to the direction in which the plurality of heat dissipation bodies 13 are aligned than in the direction in which the plurality of heat dissipation bodies 13 are aligned. Due to the above configuration, heat transfer is suppressed in the direction in which the plurality of heat dissipation bodies 13 of the first substrate 11 and the second substrate 12 are aligned, and it is possible to increase the heat transfer in the direction perpendicular to the direction in which the plurality of heat dissipation bodies 13 on the first substrate 11 and the second substrate 12 are aligned. Therefore, it is possible to restrain heat from staying in the substrate for mounting electronic element 1 and to improve the heat dissipation of the substrate for mounting electronic element 1. As a result, the distortion of the substrate for mounting electronic element 1 can be suppressed.

Further, if the heat conduction of the second substrate 12 is larger than the heat conduction of the first substrate 11 and smaller than the heat conduction of the plurality of heat dissipation bodies 13 in the direction perpendicular to the direction in which the plurality of heat dissipation bodies 13 are aligned (the x direction in FIGS. 1A to 4B), if the heat generated in the electronic element 2 or the metal layer 14 is transferred toward the second substrate 12 via the first substrate 11, heat is favorably transferred in the second substrate 12 and heat dissipation is facilitated, and if heat is diffused and transferred in the thickness direction of the plurality of heat dissipation bodies 13 to the adjacent heat dissipation bodies 13 via the second substrate 12, heat can be satisfactorily transferred in the direction perpendicular to the direction in which the plurality of heat dissipation bodies 13 are aligned at the boundary between the second substrate 12 and the heat dissipation body 13. Therefore, if the electronic element 2 is operated, the heat dissipation of the substrate for mounting electronic element 1 becomes good, and thus the distortion of the substrate for mounting electronic element 1 can be suppressed and the electronic element 2 can be operated for a long time. Also, since heat can be satisfactorily transferred in the direction perpendicular to the longitudinal direction of the at least one mounting portion 11a at the boundary between the second substrate 12 and the heat dissipation body 13, if the electronic element 2 is operated, the heat dissipation of the substrate for mounting electronic element 1 becomes good. As a result, the distortion of the substrate for mounting electronic element 1 can be suppressed and the electronic element 2 can be operated for a long time.

Further, if the heat conduction of the second substrate 12 is larger than the heat conduction of the plurality of heat dissipation bodies 13 in the direction in which the plurality of heat dissipation bodies 13 are aligned (they direction in FIGS. 1A to 4B) and is smaller than the heat conduction of the plurality of heat dissipation bodies 13 in the direction perpendicular to the direction in which the plurality of heat dissipation bodies 13 are aligned (the x direction in FIGS. 1A to 4B), even if heat is transferred to the adjacent heat dissipation body 13 via the second substrate 12, it is difficult to transfer heat in the direction in which the plurality of heat dissipation bodies 13 are aligned at the boundary between the second substrate 12 and the heat dissipation body 13 (the y direction in FIGS. 1A to 4B) and it is easy to transfer heat in the direction perpendicular to the direction in which the plurality of heat dissipation bodies 13 are aligned (the x direction in FIGS. 1A to 4B). Therefore, the heat transferred from the second substrate 12 can be restrained from being transferred toward the electronic element 2, and the heat of the second substrate 12 can be satisfactorily transferred in the direction perpendicular to the direction in which the plurality of heat dissipation bodies 13 are aligned. Thus, if the electronic element 2 is operated, the heat dissipation of the substrate for mounting electronic element 1 becomes good, the distortion of the substrate for mounting electronic element 1 can be suppressed, and thus the electronic element 2 can be operated for a long time. In addition, the heat transferred from the second substrate 12 can be satisfactorily transferred in the direction perpendicular to the longitudinal direction of the at least one mounting portion 11a, and even if the electronic element 2 is continuously operated for a long period of time, the heat dissipation of the substrate for mounting electronic element 1 will be good. As a result, the distortion of the substrate for mounting electronic element 1 can be suppressed and the electronic element 2 can be continuously operated for a long period of time.

Especially if an optical element such as LD or LED is mounted as the electronic element 2, by suppressing the distortion of the substrate for mounting electronic element 1, it is possible to make the substrate for mounting electronic element 1 for an optical device capable of accurately emitting light.

The substrate for mounting electronic element 1 according to the embodiment can be suitably used in a thin and high-power electronic device and the reliability of the substrate for mounting electronic element 1 can be improved. For example, if an optical element such as an LD or LED is mounted as the electronic element 2, it can be preferably used as a substrate for mounting electronic element 1 for an optical device that is thin and has excellent directivity.

If the plurality of heat dissipation bodies 13 are larger than (larger than the electronic element 2) the mounting portion 11a in a transparent plan view as in the example illustrated in FIGS. 1A to 4B, the heat of the electronic element 2 is satisfactorily transferred to the heat dissipation body 13, which is located so as to overlap with the electronic element 2 in a transparent plan view, and heat is easily satisfactorily transferred in the direction perpendicular to the direction in which the plurality of heat dissipation bodies 13 are aligned, and further heat transfer is suppressed in the direction in which the plurality of heat dissipation bodies 13 adjacent to the electronic element 2 are aligned. Therefore, the distortion of the substrate for mounting electronic element 1 can be suppressed. Further, heat transfer in the longitudinal direction of the at least one mounting portion 11a is suppressed via the heat dissipation body 13, and thus it is possible to restrain heat from staying in the substrate for mounting electronic element 1 and suppress distortion of the substrate for mounting electronic element 1.

If the metal layer 14 does not overlap with the heat dissipation body 13 in a transparent plan view as in the example illustrated in FIGS. 1A to 4B, that is, is arranged outside the outer edge of the heat dissipation body 13, the heat of the electronic element 2 is more easily transferred toward the heat dissipation body 13 than the metal layer 14, and the heat of the electronic element 2 is hard to be transferred to the position facing the electronic element 2 via the metal layer 14. As a result, the distortion of the substrate for mounting electronic element 1 can be suppressed well.

Further, in a plan view (a transparent plan view), the metal layers 14 are located so as to interpose the heat dissipation body 13 in the direction in which the plurality of heat dissipation bodies 13 are aligned, the heat transmitted to the metal layer 14 becomes more easily dissipated in the metal layer 14, and the heat transfer in the direction in which the heat dissipation bodies 13 adjacent to the electronic element 2 are aligned via the metal layer 14 is suppressed. Therefore, the heat of the electronic element 2 is satisfactorily transferred to the direction perpendicular to the direction in which the plurality of heat dissipation bodies 13 are aligned via the heat dissipation body 13, and thus the distortion of the substrate for mounting electronic element 1 can be suppressed more effectively.

Further, if the metal layer 14 and the heat dissipation body 13 are alternately located in the direction in which the plurality of heat dissipation bodies 13 are aligned in a plan view (a transparent plan view), the heat transferred to the metal layer 14 is effectively dissipated in the metal layer 14 and the heat transfer in the direction in which the heat dissipation bodies 13 adjacent to the electronic element 2 are aligned via the metal layer 14 is suppressed. Therefore, the heat of the electronic element 2 is satisfactorily transferred via the heat dissipation body 13 in the direction perpendicular to the direction in which the plurality of heat dissipation bodies 13 are aligned. As a result, the distortion of the substrate for mounting electronic element 1 can be suppressed better.

In a longitudinal cross-sectional view in the direction perpendicular to the direction in which the plurality of heat dissipation bodies 13 are aligned, as shown in the example illustrated in FIG. 2, if the plurality of heat dissipation bodies 13 have greater heat conduction in the thickness direction (the z direction in FIGS. 1A to 4B) than in the direction perpendicular to the thickness direction (the y direction in FIGS. 1A to 4B), heat transfer in the direction in which the plurality of heat dissipation bodies 13 are aligned can be suppressed and heat transfer in the thickness direction of the plurality of heat dissipation bodies 13 can be increased. Therefore, it is possible to restrain heat from staying in the substrate for mounting electronic element 1 and to improve the heat dissipation of the substrate for mounting electronic element 1. As a result, distortion of the substrate for mounting electronic element 1 can be suppressed.

Since the heat conduction in the direction (the x direction in FIGS. 1A to 4B) perpendicular to the direction in which the plurality of heat dissipation bodies 13 are aligned and in the thickness direction (the z direction in FIGS. 1A to 4B) of the plurality of heat dissipation bodies 13 is greater than the thermal conductivity in the direction in which the plurality of heat dissipation bodies 13 are aligned (they direction in FIGS. 1A to 4B), it is possible to suppress heat transfer in the direction in which the plurality of heat dissipation bodies 13 are aligned and to improve heat dissipation of the substrate for mounting electronic element 1. As a result, the distortion of the substrate for mounting electronic element 1 can be suppressed.

Further, as in the example illustrated in FIGS. 1A to 4B, in a plan view, the plurality of heat dissipation bodies 13 are located in series in the longitudinal direction of the first substrate 11, each heat dissipation body 13 suppresses heat transfer in the longitudinal direction of the first substrate 11, and thus the heat of the electronic element 2 can be satisfactorily transferred via the heat dissipation body 13 in the direction perpendicular to the direction in which the plurality of heat dissipation bodies 13 are aligned.

In accordance with the electronic device according to the embodiment, by including the substrate for mounting electronic element 1 including the above configuration, the electronic element 2 mounted on the mounting portion 11a of the substrate for mounting electronic element 1, and the wiring substrate 4 on which the substrate for mounting electronic element 1 is to be mounted or the package for housing the electronic element 5, the electronic device having excellent long-term reliability can be provided.

In accordance with the electronic module according to the embodiment, by having the electronic device including the above configuration and the module substrate 6 to which the electronic device is to be connected, it is possible to provide excellent long-term reliability.

Second Embodiment

Next, a substrate for mounting electronic element according to a second embodiment will be described with reference to FIGS. 5 to 6B.

In the substrate for mounting electronic element 1 according to the second embodiment, a difference from the substrate for mounting electronic element 1 of the above-described embodiment is that a third substrate 16 is located on the fourth surface 122 of the second substrate 12 and the sixth surfaces 132 of the plurality of heat dissipation bodies 13. That is, the heat dissipation body 13 located in the through hole 12a of the second substrate 12 is covered with the first substrate 11 and the third substrate 16 and the second substrate 12 so as not to be exposed.

Figure 5:
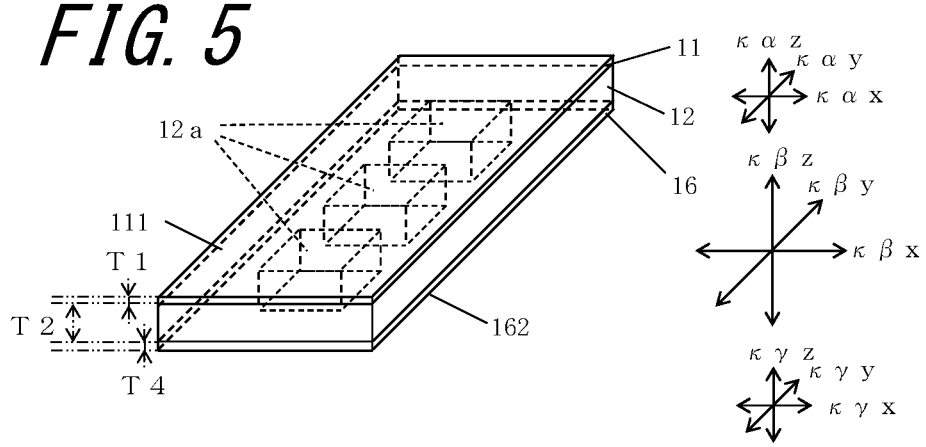
FIG. 5 is an exploded perspective view of a first substrate, a second substrate, and a heat dissipation body of a substrate for mounting electronic element according to a second embodiment.
Figure 5:
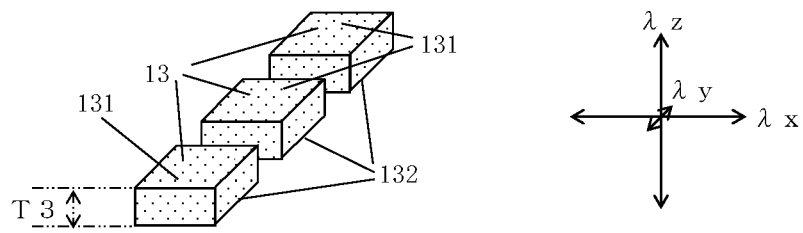
Figure 5:
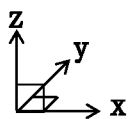
Figure 6A:
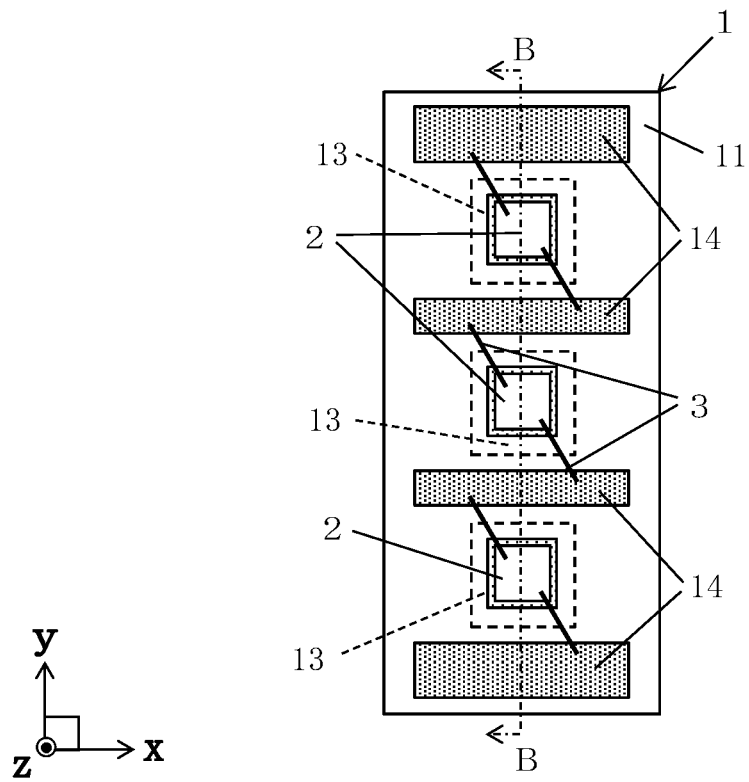
FIG. 6A is a top view illustrating a state in which an electronic element is mounted on the substrate for mounting electronic element according to the second embodiment.
Figure 6B:
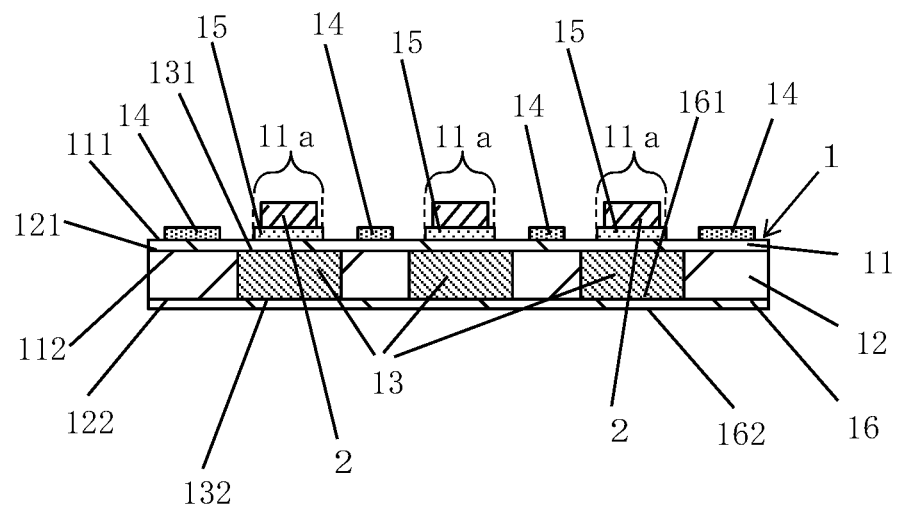
FIG. 6B is a vertical cross-sectional view taken along the line B-B of FIG. 6A.

In the example illustrated in FIGS. 5 to 6B, in the substrate for mounting electronic element 1, three heat dissipation bodies 13 are located in series within the through holes 12a of the second substrate 12, and four metal layers 14 are located on the first surface 111 of the first substrate 11.

The plurality of heat dissipation bodies 13 are shaded in the example illustrated in FIG. 5. The metal layer 14 and a mounting layer 15 are shaded in the example illustrated in FIGS. 6A and 6B. In the example illustrated in FIG. 6A, a region overlapping with the outer surface of the heat dissipation body 13 of the first substrate 11 in a transparent plan view is shown by a broken line. In the example illustrated in FIG. 2, in the first substrate 11 and the third substrate 16, the outer surface of the first substrate 11 which is invisible in a perspective view is indicated by a broken line. In the example illustrated in FIG. 5, in the second substrate 12, the outer surface of the second substrate 12 and the inner surface of the through hole 12a which are invisible in a perspective view are shown by broken lines. The mounting portion 11a of the electronic element 2 is arranged so as to overlap the heat dissipation body 13 if seen in a transparent plan view.

The third substrate 16 includes a seventh surface 161 (an upper surface in FIGS. 5 to 6B) facing the fourth surface 122 of the second substrate 12 and the sixth surfaces 132 of the plurality of heat dissipation bodies 13 and an eighth surface 162 (a lower surface in FIGS. 5 to 6B) opposite to the seventh surface 161. The third substrate 16 has a rectangular plate-like shape including two sets of opposing sides (4 sides) with respect to each of the seventh surface 161 and the eighth surface 162 in a plan view.

Since the third substrate 16 includes the seventh surface 161 facing the fourth surface 122 of the second substrate 12 and the sixth surfaces 132 of the plurality of heat dissipation bodies 13 and the eighth surface 162 opposite to the seventh surface 161, the distortion of the substrate for mounting electronic element 1 due to the difference in thermal expansion between the first substrate 11 and the second substrate 12 and the plurality of heat dissipation bodies 13 is suppressed and the displacement of the electronic element 2 or the distortion of the substrate for mounting electronic element 1 is suppressed. As a result, the electronic element 2 can be operated for a long time.

The third substrate 16 can be manufactured by using the same material and method as those of the first substrate 11 described above. As in the example illustrated in FIGS. 6A and 6B, as similar to the first substrate 11, the thermal conductivity λy of the third substrate 16 is substantially constant in the x and y directions in the planar direction, and the thermal conductivity in the z direction, which is the thickness direction, of the third substrate 16 is also the same as the thermal conductivity in the x and y directions in the planar direction ($\lambda\gamma x \approx \lambda\gamma y \approx \lambda\gamma z$). For example, if an aluminum nitride sintered body is used as the third substrate 16, a substrate having a thermal conductivity λy of about 100 to 200 W/m·K is used as the third substrate 16.

In the substrate for mounting electronic element 1 according to the second embodiment, the second surface 112 of the first substrate 11, the third surface 121 of the second substrate 12, and the fifth surfaces 131 of the plurality of heat dissipation bodies 13 are joined by a bonding material such as an active brazing material made of TiCuAg alloy, TiSnAgCu alloy, or the like. Also, the seventh surface 161 of the third substrate 16, the fourth surface 122 of the second substrate 12, and the sixth surfaces 132 of the plurality of heat dissipation bodies 13 are joined by a bonding material such as an active brazing material made of TiCuAg alloy, TiSnAgCu alloy, or the like.

Also in the substrate for mounting electronic element 1 according to the second embodiment, as similar to the first embodiment, the first substrate 11, the second substrate 12, the plurality of heat dissipation bodies 13, and the third substrate 16 are quadrangular in a plan view. A quadrangular composite substrate is formed by bonding the first substrate 11, the second substrate 12, the plurality of heat dissipation bodies 13, and the third substrate 16. In the example shown in FIGS. 5 to 6B, the first substrate 11, the second substrate 12, and the third substrate 16 have a rectangular shape and a rectangular composite substrate is formed.

The first substrate 11, the second substrate 12, the plurality of heat dissipation bodies 13, and the third substrates 16 may be joined at the same time. For example, the heat dissipation body 13 may be located in the through hole 12a of the second substrate 12 and the first substrate 11 and the third substrate 16 may be joined to the second substrate 12 and the plurality of heat dissipation bodies 13 to form the same. In this case, for example, by joining while applying pressure from the first surface 111 side of the first substrate 11 and the eighth surface 162 side of the third substrate 16, the first substrate 11, the second substrate 12, the plurality of heat dissipation bodies 13, and the third substrate 16 are well bonded to each other, and thus the substrate for mounting electronic element 1 having excellent reliability can be obtained. Also, by bonding the first substrate 11, the second substrate 12, the plurality of heat dissipation bodies 13, and the third substrate 16 at the same time, it is possible to suppress the exposure of the plurality of heat dissipation bodies 13 during manufacturing, and thus the deterioration due to the outside air can be suppressed.

Since the second substrate 12 and the plurality of heat dissipation bodies 13 are located between the first substrate 11 and the third substrate 16, the distortion of the substrate for mounting electronic element 1 due to the difference in thermal expansion between the first substrate 11 and the second substrate 12 and the plurality of heat dissipation bodies 13 is suppressed. Therefore, by suppressing the displacement of the electronic element 2 or the distortion of the substrate for mounting electronic element 1, favorable light emission can be facilitated.

In particular, if the third substrate 16 uses a substrate of the same material as the first substrate 11, that is, if using an aluminum nitride sintered body with 150 W/m·K for example, as the first substrate 11, if the aluminum nitride sintered body with 150 W/m·K is used as the third substrate 16, the distortion of the substrate for mounting electronic element 1 is more effectively suppressed. As a result, the light can be easily emitted favorably.

The substrate thickness T1 of the first substrate 11 is, for example, about 50 μm to 500 μm and the substrate thickness T2 of the second substrate 12 is, for example, about 100 μm to 2000 μm. The substrate thickness T3 of the plurality of heat dissipation bodies 13 is, for example, about 100 μm to 2000 μm.

The substrate thickness of the third substrate 16 is, for example, about 50 μm to 500 μm, as similar to the substrate thickness T1 of the first substrate 11. If the substrate thickness T1 of the first substrate 11 and the substrate thickness T4 of the third substrate 16 are located at the same thickness within a range of about 10% (0.90T1≤T4≤1.10T1), by suppressing the distortion of the substrate for mounting electronic element 1 more effectively, it is possible to easily satisfactorily emit light. For example, if the substrate thickness of the first substrate 11 is 100 μm, the substrate thickness of the third substrate 16 may be 100 μm (90 μm to 110 μm).

The substrate thickness T1 of the first substrate 11 and the substrate thickness T4 of the third substrate 16 may be smaller than the substrate thickness T3 of the plurality of heat dissipation bodies 13 (T3>T1, T3>T4).

Further, as illustrated in the examples of FIGS. 5 to 6B, the mounting layer 15 may be located in the mounting portion 11a of the first substrate 11. The mounting layer 15 is used as a mounting area for the electronic element 2. Joining the substrate for mounting electronic element 1 and the electronic element 2 or the heat dissipation of the electronic element 2 to the substrate for mounting electronic element 1 can be made favorable. The mounting layer 15 may be smaller than the plurality of heat dissipation bodies 13 in a transparent plan view. The mounting layer 15 can be manufactured by a method similar to that of the metal layer 14 described above.

In addition, the third substrate 16 may include a bonding layer located on the eighth surface 162 side. The bonding layer located on the third substrate 16 can be used for bonding the substrate for mounting electronic element 1 and the conductor layer located on the wiring substrate 4 or the package for housing electronic element 5, for example. The bonding layer can be manufactured by a method similar to that of the metal layer 14 described above. In addition, the bonding layer is located on substantially the entire lower surface of the third substrate 16 so as to cover the plurality of heat dissipation bodies 13 in a transparent plan view, and thus the heat dissipation from the substrate for mounting electronic element 1 to the wiring substrate 4 or the package for housing electronic element 5 can be made favorable.

The mounting layer 15 and the bonding layer include a plating layer on the surface thereof, similar to the metal layer 14.

Figure 7:
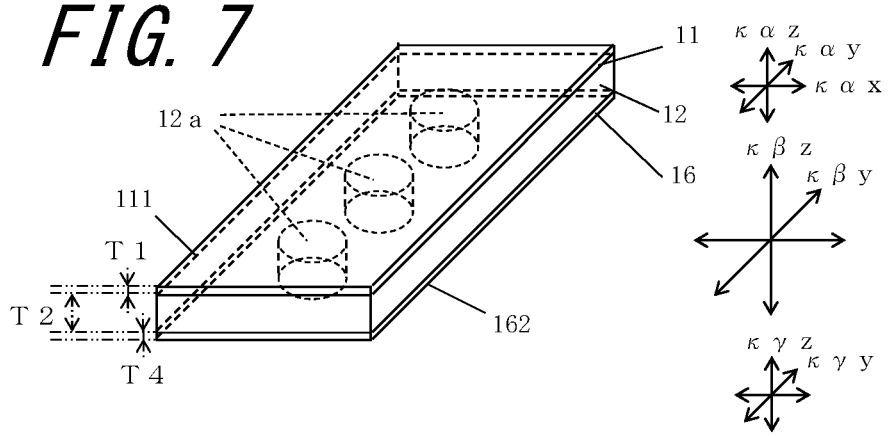
FIG. 7 is an exploded perspective view of a first substrate, a second substrate, and a heat dissipation body of another example of the substrate for mounting electronic element according to the second embodiment.
Figure 7:
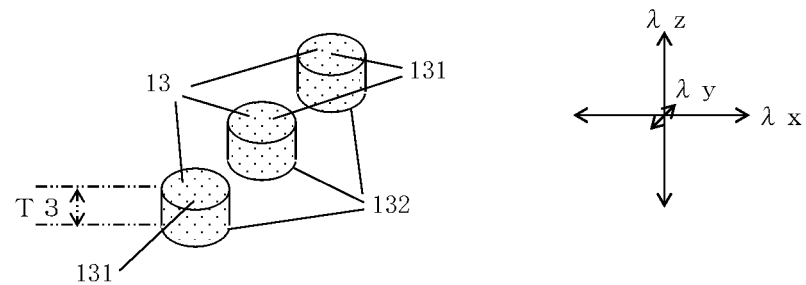
Figure 7:
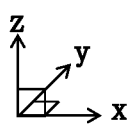
Figure 8A:
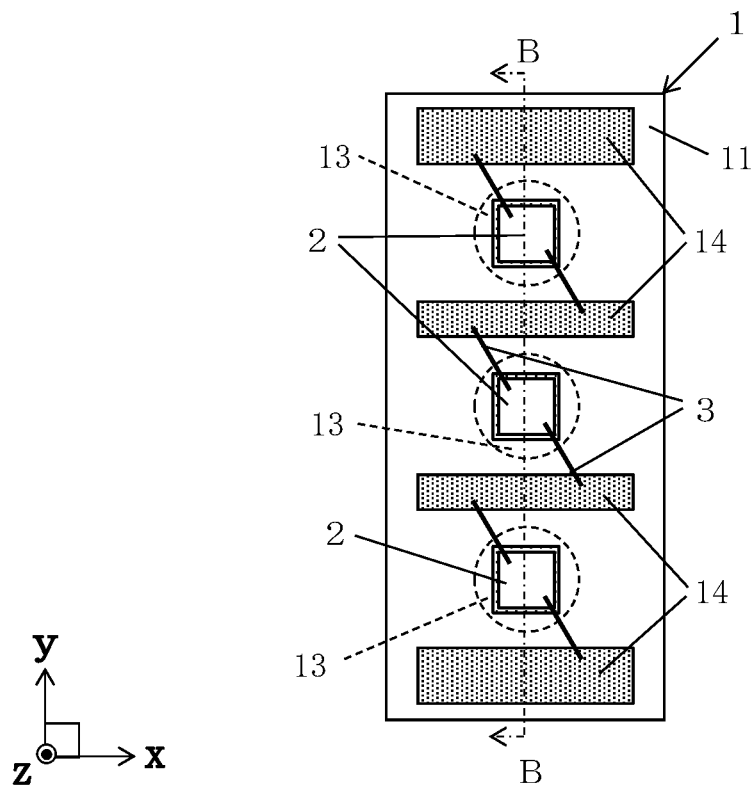
FIG. 8A is a top view illustrating a state in which an electronic element is mounted on another example of the substrate for mounting electronic element according to the second embodiment.
Figure 8B:
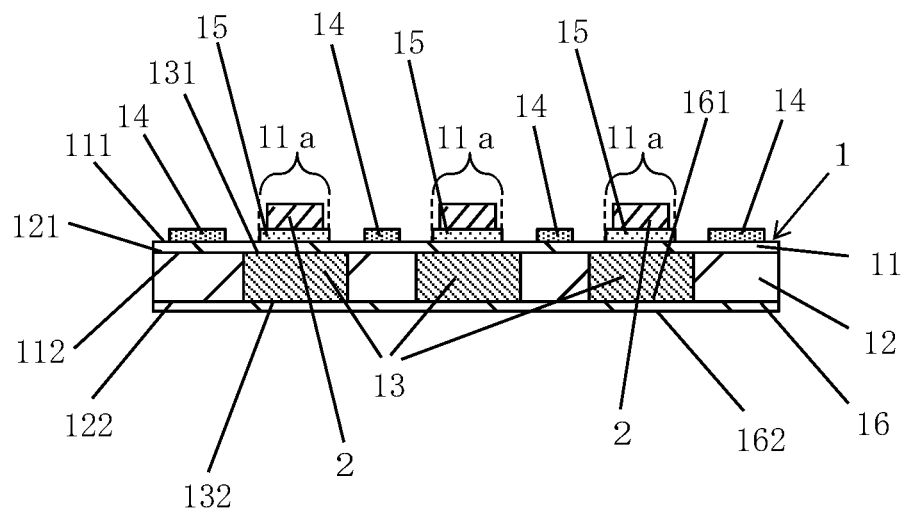
FIG. 8B is a vertical cross-sectional view taken along the line B-B of FIG. 8A.

Further, as in the example illustrated in FIGS. 7 to 8B, the plurality of heat dissipation bodies 13 may have a circular shape, a polygonal shape, or the like in a plan view.

The substrate for mounting electronic element 1 according to the second embodiment can be manufactured by using the same manufacturing method as that of the substrate for mounting electronic element 1 according to the above embodiment.

Third Embodiment

Next, an electronic device according to a third embodiment will be described with reference to FIGS. 9 to 10B.

In the substrate for mounting electronic element 1 according to the third embodiment, a difference from the substrates for mounting electronic element 1 according to the above-described embodiments is that the heat dissipation body 13 is longer in the direction perpendicular to the direction in which the plurality of heat dissipation bodies 13 are aligned than in the direction in which the plurality of heat dissipation bodies 13 are aligned.

Figure 9:
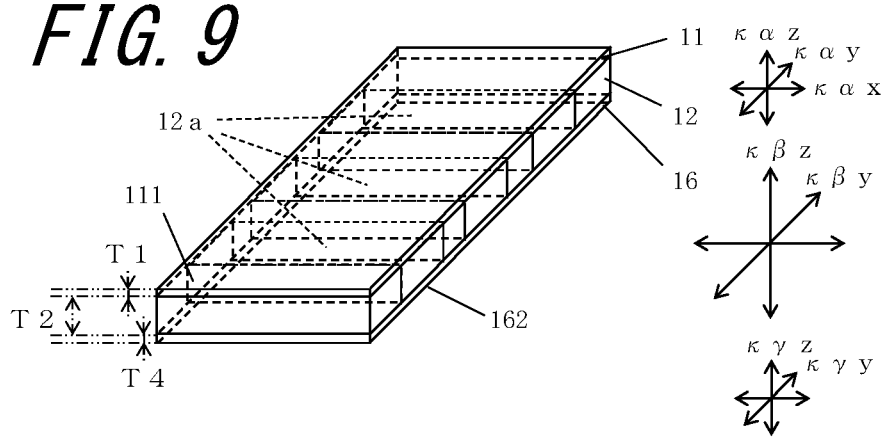
FIG. 9 is an exploded perspective view of a first substrate, a second substrate, and a heat dissipation body of a substrate for mounting electronic element according to a third embodiment.
Figure 9:
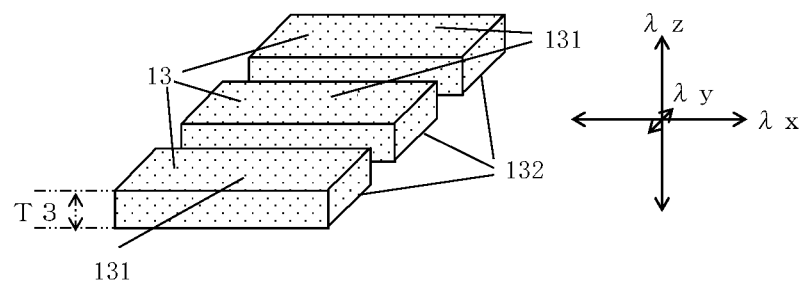
Figure 9:
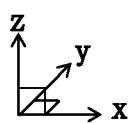
Figure 10A:
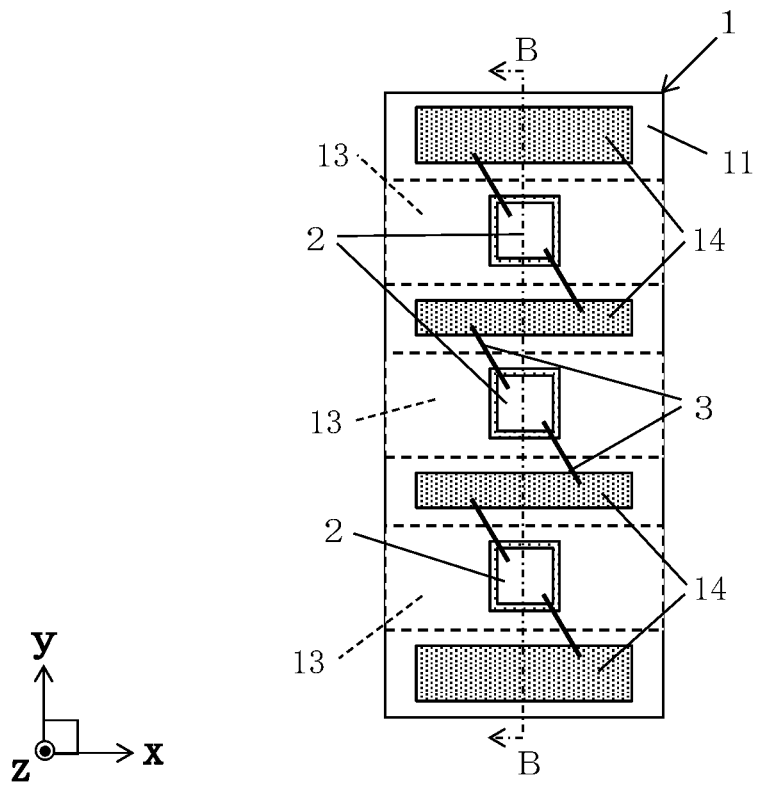
FIG. 10A is a top view illustrating a state in which an electronic element is mounted on the substrate for mounting electronic element according to the third embodiment.
Figure 10B:
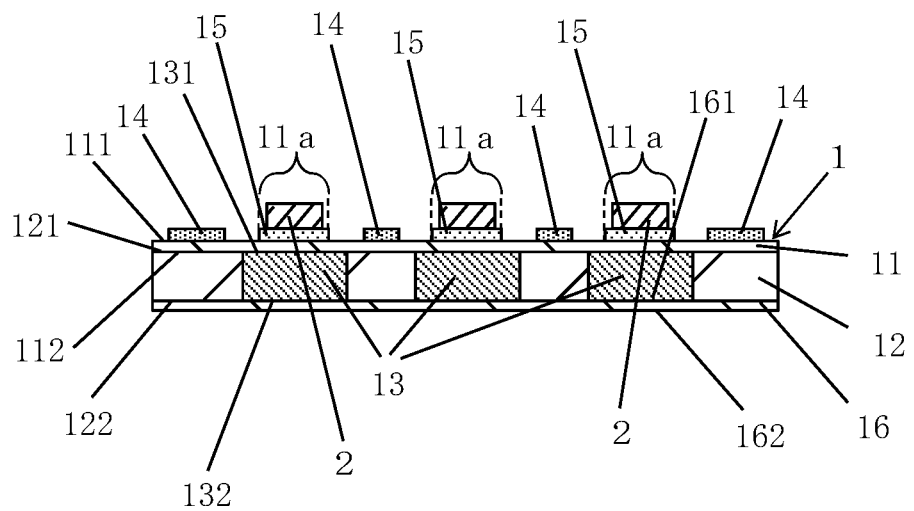
FIG. 10B is a vertical cross-sectional view taken along the line B-B of FIG. 10A.

In the example illustrated in FIGS. 9 to 10B, in the substrate for mounting electronic element 1, the three heat dissipation bodies 13 are located in series within the through holes 12a of the second substrate 12, and the four metal layers 14 are located on the first surface 111 of the first substrate 11.

The plurality of heat dissipation bodies 13 are shaded in the example illustrated in FIG. 9. The metal layer 14 and the mounting layer 15 are shaded in the example illustrated in FIGS. 10A and 10B. In the example illustrated in FIG. 10A, a region overlapping with the outer surfaces of the plurality of heat dissipation bodies 13 of the first substrate 11 in a transparent plan view is shown by a broken line. In the example illustrated in FIG. 9, in the first substrate 11 and the third substrate 16, the outer surface of the first substrate 11 which is invisible in a perspective view is illustrated by a broken line. In the example illustrated in FIG. 9, in the second substrate 12, the outer surface of the second substrate 12 and the inner surface of the through hole 12a which are invisible in a perspective view are illustrated by broken lines. The mounting portion 11a of the electronic element 2 is arranged so as to overlap the heat dissipation body 13 if seen in a transparent plan view.

In the substrate for mounting electronic element 1 according to the third embodiment, if the heat dissipation body 13 is long in the direction perpendicular to the direction in which the plurality of heat dissipation bodies 13 are aligned, the heat transfer in the direction perpendicular to the direction in which the plurality of heat dissipation bodies 13 are aligned can be further increased. Therefore, the distortion of the substrate for mounting electronic element 1 can be suppressed.

Further, if the plurality of heat dissipation bodies 13, as in the example illustrated in FIGS. 9 to 10B, extend in the side surface of the substrate for mounting electronic element 1 in a direction perpendicular to the direction in which the plurality of heat dissipation bodies 13 are aligned, the heat transfer between the electronic elements 2 is suppressed, and thus the heat dissipation of the substrate for mounting electronic element 1 is improved. As a result, the distortion of the substrate for mounting electronic element 1 can be suppressed.

Further, a member having a high heat conduction may be brought into contact with the exposed side surfaces of the plurality of heat dissipation bodies 13 to enhance the heat dissipation property.

In the substrate for mounting electronic element 1 according to the third embodiment, the substrate thickness T1 of the first substrate 11 and the substrate thickness T4 of the third substrate 16 are, for example, about 50 μm to 500 μm, and the substrate thickness T2 of the second substrate 12 and the substrate thickness T3 of the plurality of heat dissipation bodies 13 are, for example, about 100 μm to 2000 μm.

Further, also in the substrate for mounting electronic element 1 according to the third embodiment, similar to the substrate for mounting electronic element 1 according to the second embodiment, the mounting layer 15 may be smaller than the heat dissipation body 13 and may be located inside the heat dissipation body 13 in a transparent plan view.

Further, also in the substrate for mounting electronic element 1 according to the third embodiment, if the substrate thickness T1 of the first substrate 11 and the substrate thickness T4 of the third substrate 16 are located at the same thickness within a range of about 10% (0.90T1≤T4≤1.10T1), by suppressing the distortion of the substrate for mounting electronic element 1 more effectively, it is possible to easily satisfactorily emit light. For example, if the substrate thickness T1 of the first substrate 11 is 100 μm, the substrate thickness T4 of the third substrate 16 may be 100 μm (90 μm to 110 μm).

The substrate for mounting electronic element 1 according to the third embodiment can be manufactured by the same method as the substrates for mounting electronic element 1 according to the above-described embodiments.

Fourth Embodiment

Next, an electronic device according to a fourth embodiment will be described with reference to FIGS. 11 to 12B.

In the substrate for mounting electronic element 1 according to the fourth embodiment, a difference from the substrates for mounting electronic element 1 according to the above-described embodiments is that the sizes of the plurality of heat dissipation bodies 13 are different in a transparent plan view.

Figure 11:
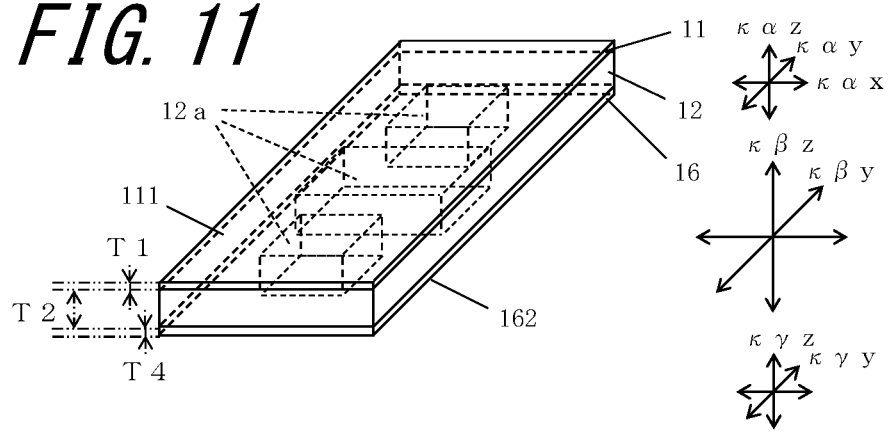
FIG. 11 is an exploded perspective view of a first substrate, a second substrate, and a heat dissipation body of a substrate for mounting electronic element according to a fourth embodiment.
Figure 11:
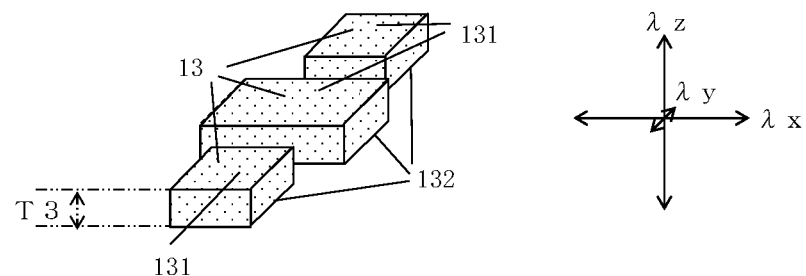
Figure 11:
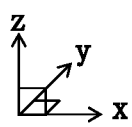
Figure 12A:
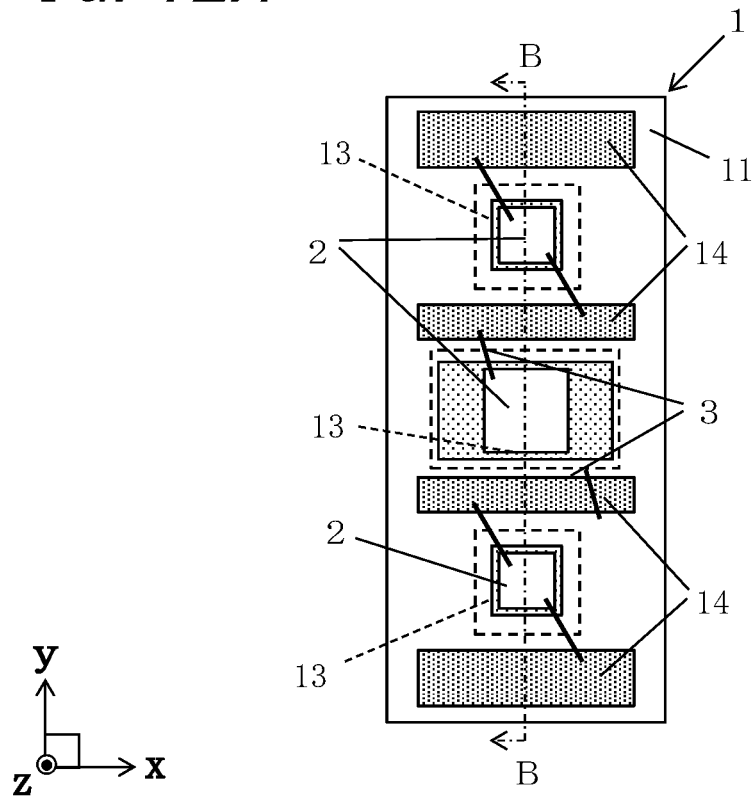
FIG. 12A is a top view illustrating a state in which an electronic element is mounted on the substrate for mounting electronic element according to the fourth embodiment.
Figure 12B:
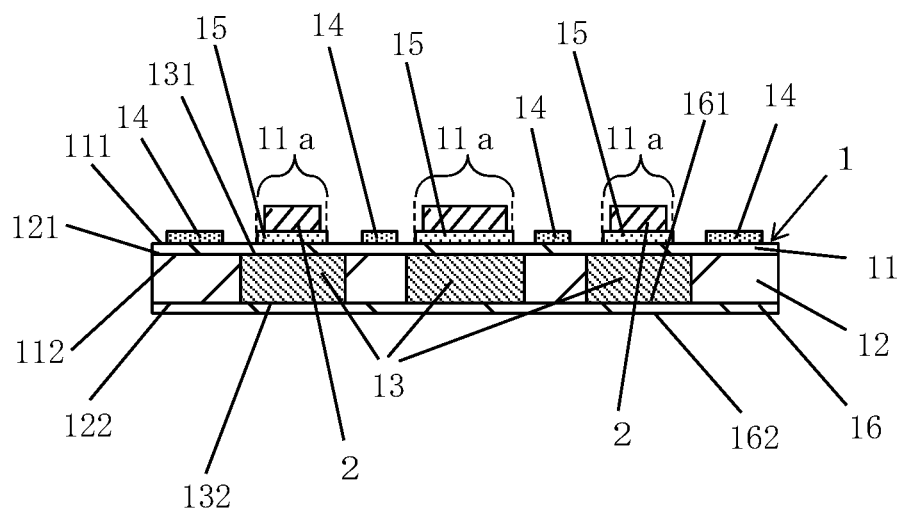
FIG. 12B is a vertical cross-sectional view taken along the line B-B of FIG. 12A.
Figure 12B:
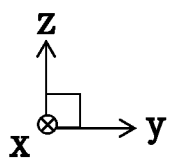

In the example illustrated in FIGS. 11 to 12B, in the substrate for mounting electronic element 1, the three heat dissipation bodies 13 are located in series in the through holes 12a of the second substrate 12, and the four metal layers 14 are located on the first surface 111 of the first substrate 11.

The plurality of heat dissipation bodies 13 are shaded in the example illustrated in FIG. 11. The metal layer 14 and the mounting layer 15 are shaded in the example illustrated in FIGS. 12A and 12B. In the example illustrated in FIG. 12A(a), a region overlapping the outer surfaces of the plurality of heat dissipation bodies 13 of the first substrate 11 in a transparent plan view is shown by a broken line. In the example illustrated in FIG. 11, in the first substrate 11 and the third substrate 16, the outer surface of the first substrate 11 which is invisible in a perspective view are shown by a broken line. In the example illustrated in FIG. 11, in the second substrate 12, the outer surface of the second substrate 12 and the inner surface of the through hole 12a which are invisible in a perspective view are shown by broken lines. The mounting portion 11a of the electronic element 2 is arranged so as to overlap the heat dissipation body 13 if seen in a transparent plan view.

In the plurality of heat dissipation bodies 13, as seen in a transparent plan view, as in the example illustrated in FIGS. 11 to 12B, if the size of the heat dissipation body 13 arranged near the central portion of the substrate for mounting electronic element 1 is larger than the size of the heat dissipation body 13 arranged near the outer peripheral portion of the substrate for mounting electronic element 1, heat transfer in the direction perpendicular to the longitudinal direction of the first substrate 11 in the vicinity of the central portion can be increased. Therefore, it is possible to suppress heat from staying in the first substrate 11 and heat dissipation of the substrate for mounting electronic element 1 is improved. As a result, the distortion of the substrate for mounting electronic element 1 can be suppressed.

The substrate for mounting electronic element 1 according to the fourth embodiment can be preferably used in an electronic device in which the plurality of mounted electronic elements 2 have different sizes. Further, as in the example illustrated in FIGS. 12A and 12B, the sizes of the mounting layer 15 may be different in a plan view.

The substrate for mounting electronic element 1 according to the fourth embodiment can be manufactured by using the same manufacturing method as those of the substrates for mounting electronic element 1 according to the above-described embodiments.

Fifth Embodiment

Next, an electronic device according to a fifth embodiment will be described with reference to FIGS. 13 to 14B.

In the substrate for mounting electronic element 1 according to the fifth embodiment, a difference from the substrates for mounting electronic element 1 according to the above-described embodiments is that the plurality of heat dissipation bodies 13 are arranged in a direction in which the plurality of heat dissipation bodies 13 are aligned and in a direction perpendicular to the direction in which the plurality of heat dissipation bodies 13 are aligned.

Figure 13:
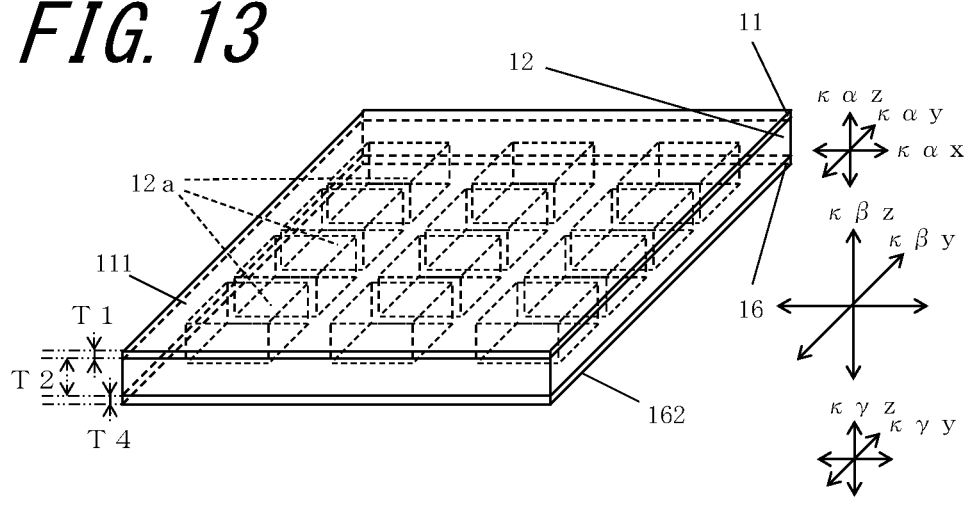
FIG. 13 is an exploded perspective view of a first substrate, a second substrate, and a heat dissipation body of a substrate for mounting electronic element according to a fifth embodiment.
Figure 13:
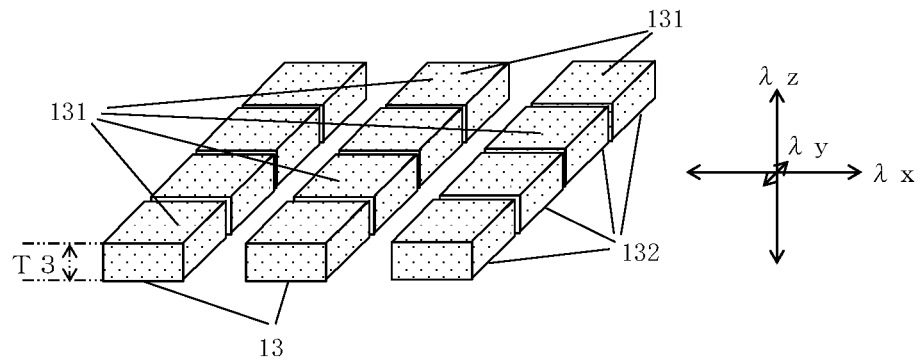
Figure 13:
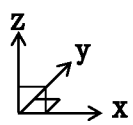
Figure 14A:
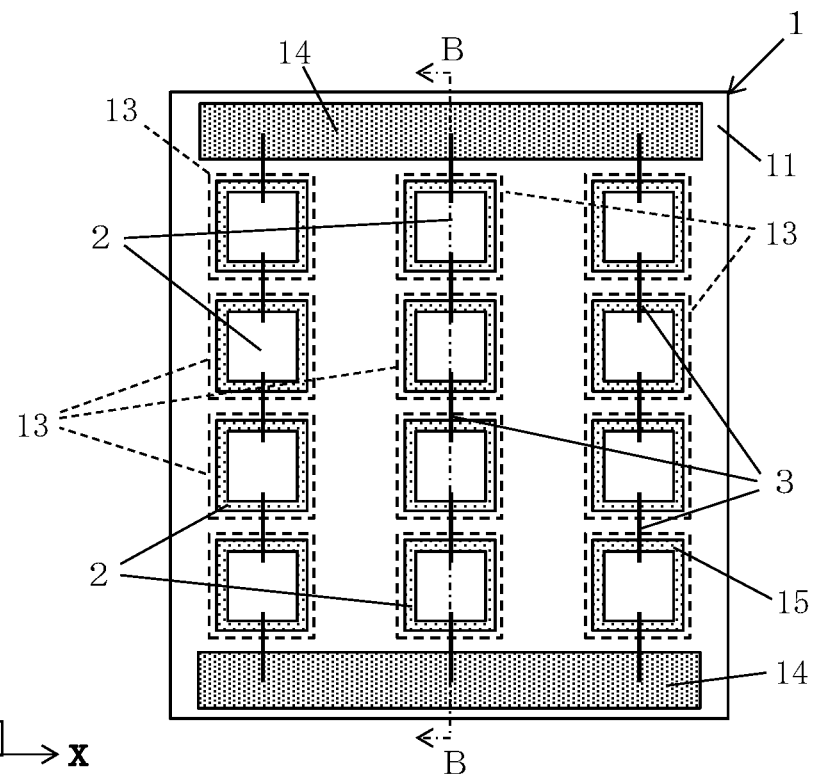
FIG. 14A is a top view illustrating a state in which an electronic element is mounted on the substrate for mounting electronic element according to the fifth embodiment.
Figure 14B:
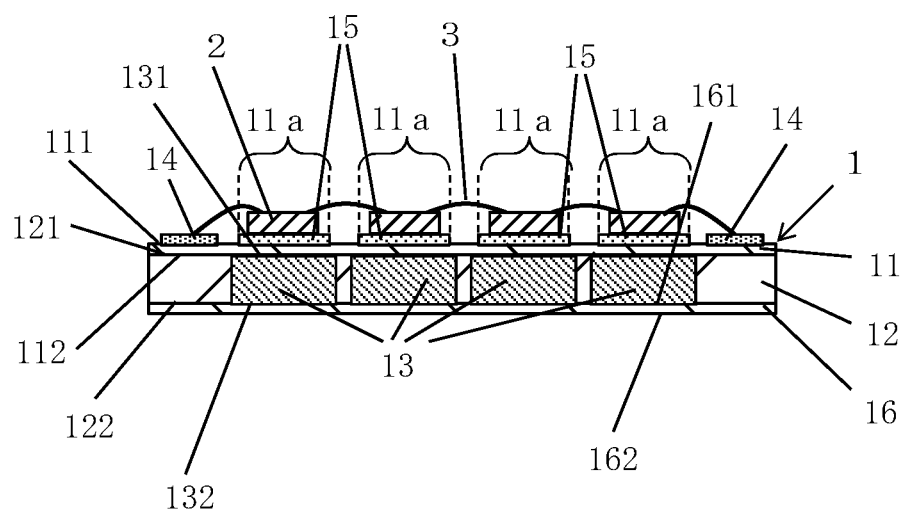
FIG. 14B is a vertical cross-sectional view taken along the line B-B of FIG. 14A.

In the example illustrated in FIGS. 13 to 14B, the substrate for mounting electronic element 1 includes the twelve heat dissipation bodies 13 located in the through holes 12a of the second substrate 12, and the two metal layers 14 are located on the first surfaces 111 of the first substrate 11.

The plurality of heat dissipation bodies 13 are shaded in the example illustrated in FIG. 13. The metal layer 14 and the mounting layer 15 are shaded in the example illustrated in FIGS. 14A and 14B. In the example illustrated in FIGS. 14A and 14B, a region overlapping with the outer surfaces of the plurality of heat dissipation bodies 13 of the first substrate 11 in a transparent plan view is shown by a broken line. In the example illustrated in FIG. 13, in the first substrate 11 and the third substrate 16, the outer surface of the first substrate 11 which is invisible in a perspective view is shown by a broken line. In the example illustrated in FIG. 13, in the second substrate 12, the outer surface of the second substrate 12 and the inner surface of the through hole 12a which are invisible in a perspective view are shown by broken lines. The mounting portion 11a of the electronic element 2 is arranged so as to overlap the heat dissipation body 13 if seen in a transparent plan view.

If an interval L1 between the adjacent heat dissipation bodies 13 in the direction perpendicular to the direction in which the plurality of heat dissipation bodies 13 are aligned (the x direction in FIGS. 14A and 14B) is larger than an interval L2 between the heat dissipation bodies 13 adjacent to each other in the direction in which the plurality of heat dissipation bodies 13 are aligned (the y direction in FIGS. 14A and 14B) (L1>L2), it is possible to reduce heat transfer in the direction perpendicular to the direction in which the plurality of heat dissipation bodies 13 are aligned. Therefore, heat dissipation of the substrate for mounting electronic element 1 is improved, and thus the distortion of the substrate for mounting electronic element 1 can be suppressed. In particular, the interval L1 between the adjacent heat dissipation bodies 13 in the direction perpendicular to the direction in which the plurality of heat dissipation bodies 13 are aligned may be at least twice the interval L2 between the adjacent heat dissipation bodies 13 in the direction in which the plurality of heat dissipation bodies 13 may be aligned (L1>2L2).

Figure 15A:
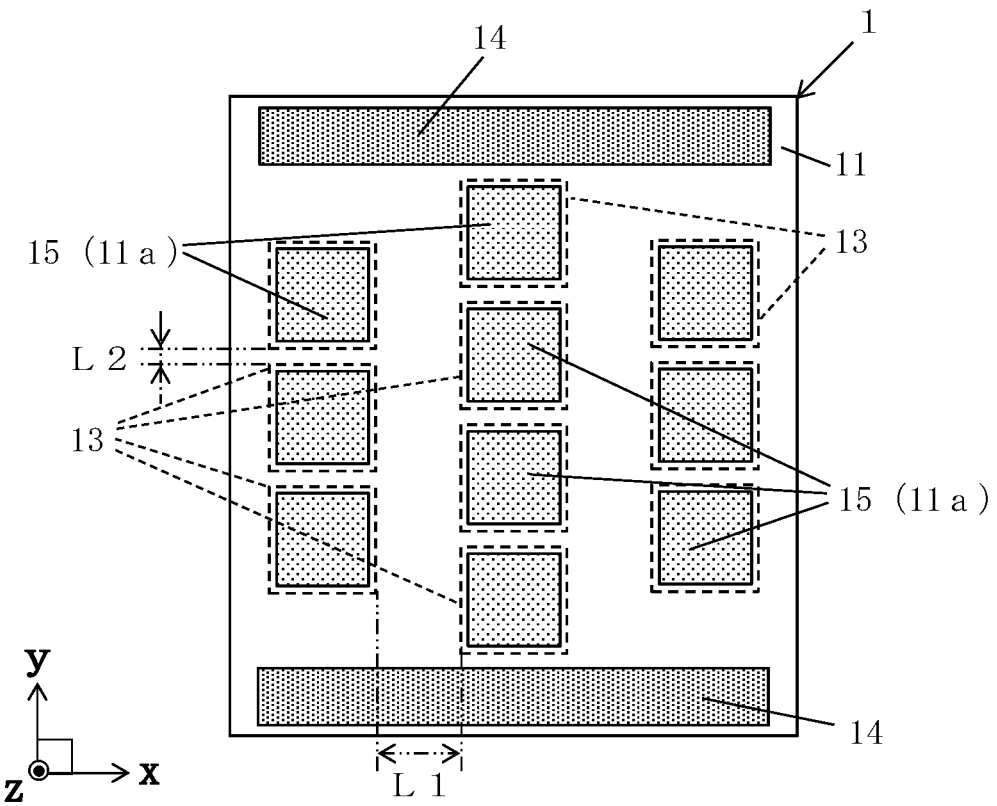
FIG. 15A is a top view illustrating another example of the substrate for mounting electronic element according to the fifth embodiment.
Figure 15B:
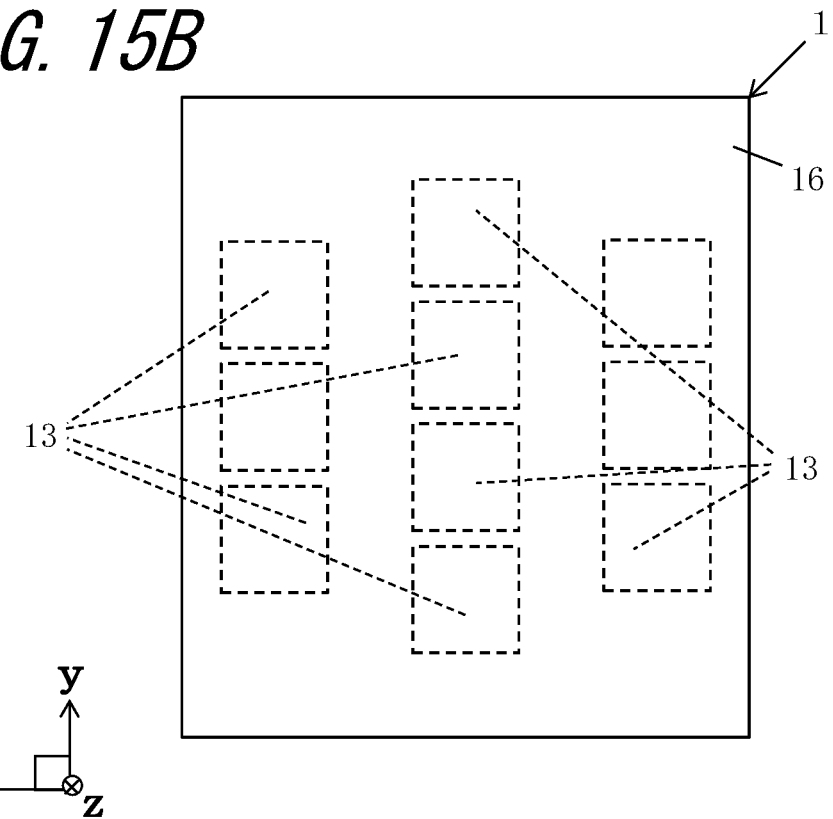
FIG. 15B is a bottom view of FIG. 15A.
Figure 16A:
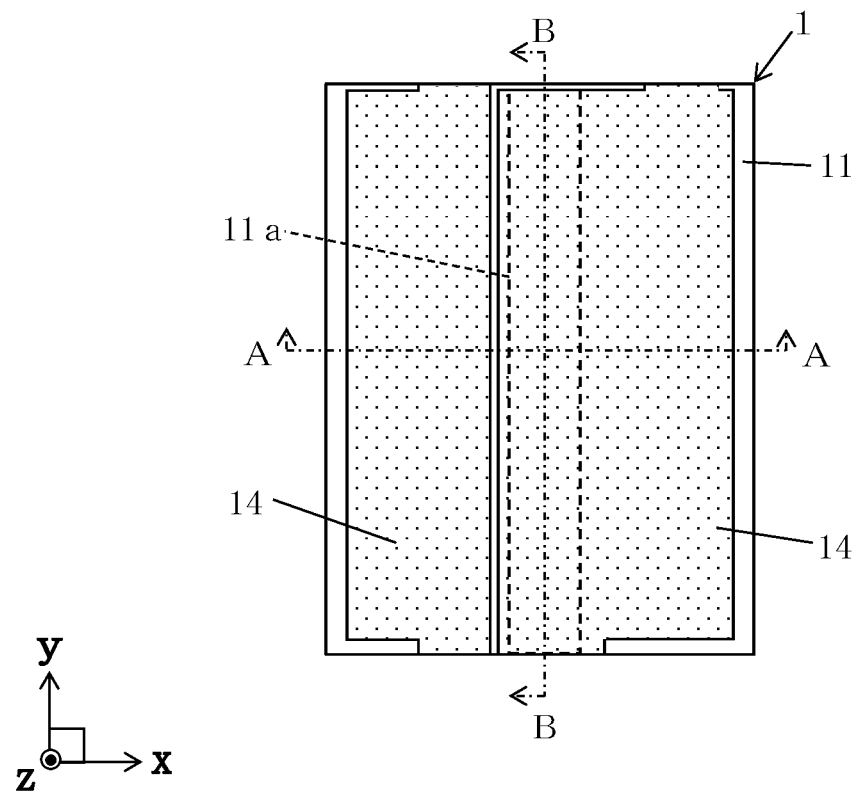
FIG. 16A is a top view illustrating a substrate for mounting electronic element according to a sixth embodiment.
Figure 16B:
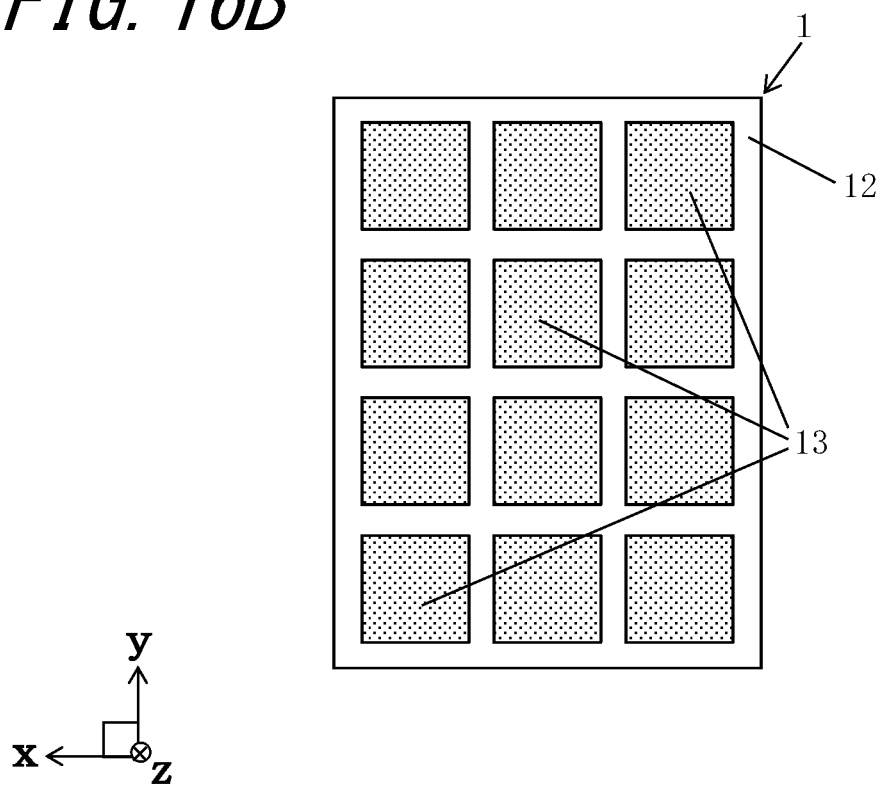
FIG. 16B is a bottom view of FIG. 16A.
Figure 17:
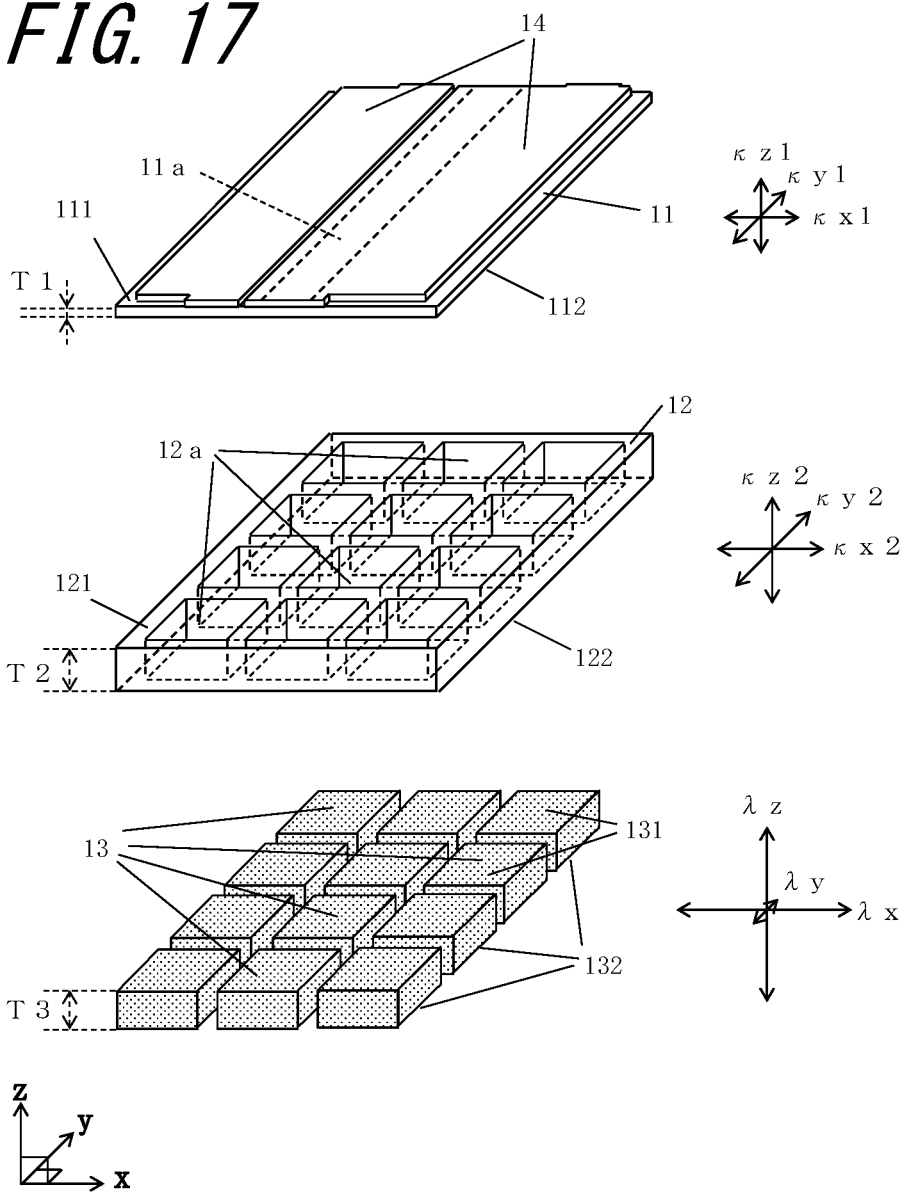
FIG. 17 is an exploded perspective view of a first substrate, a second substrate, and a heat dissipation body of the substrate for mounting electronic element illustrated in FIGS. 16A and 16B.
Figure 18A:
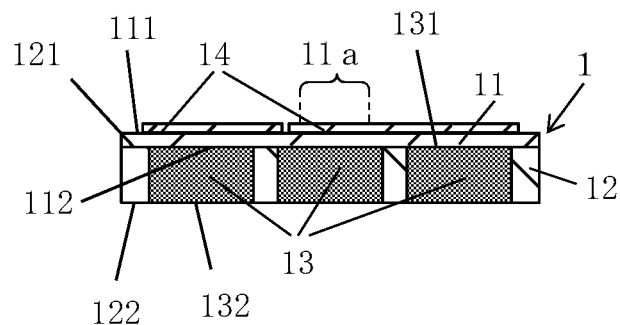
FIG. 18A is a vertical cross-sectional view taken along the line A-A of the substrate for mounting electronic element illustrated in FIG. 16A.
Figure 18A:
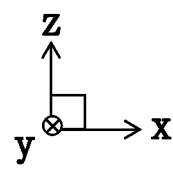
Figure 18B:
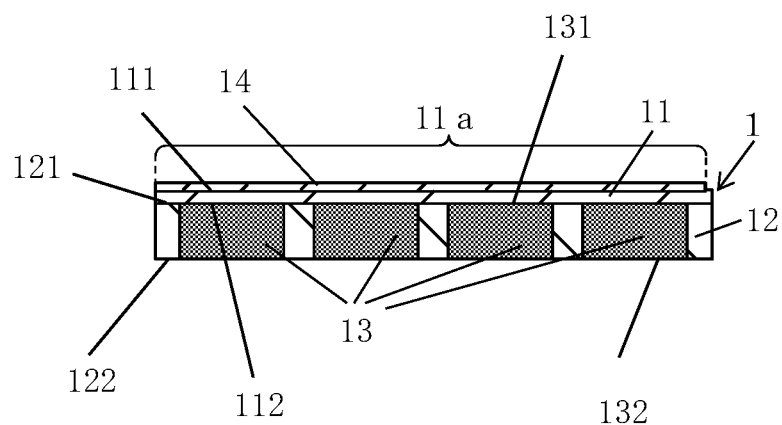
FIG. 18B is a vertical cross-sectional view of the substrate for mounting electronic element taken along the line B-B of FIG. 16A.
Figure 18B:
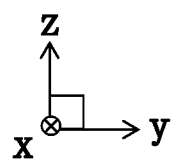
Figure 19A:
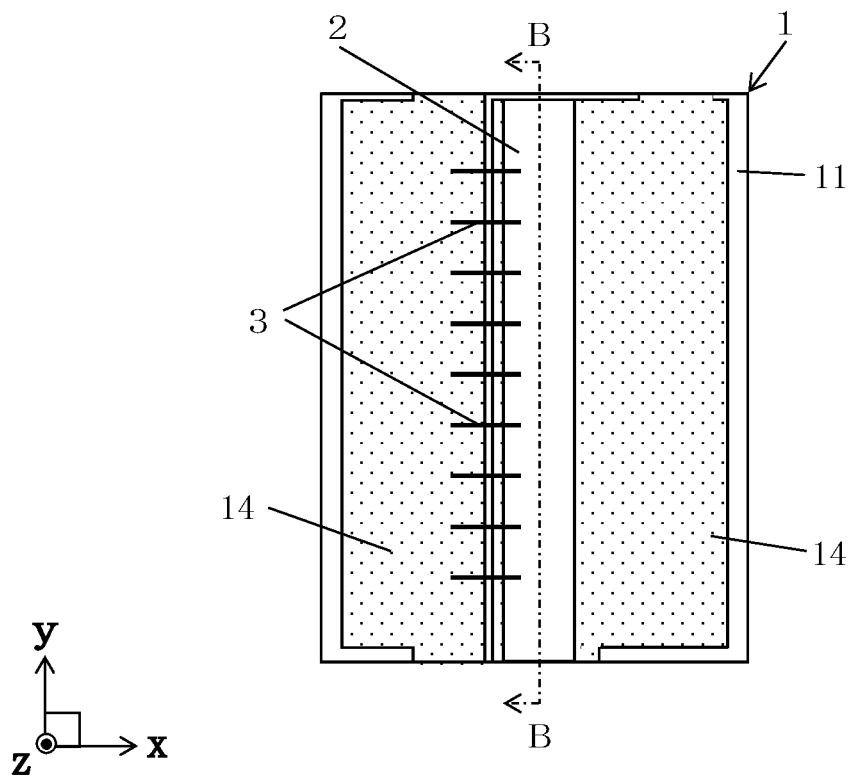
FIG. 19A is a top view illustrating a state in which an electronic element is mounted on the substrate for mounting electronic element illustrated in FIG. 16A.
Figure 19B:
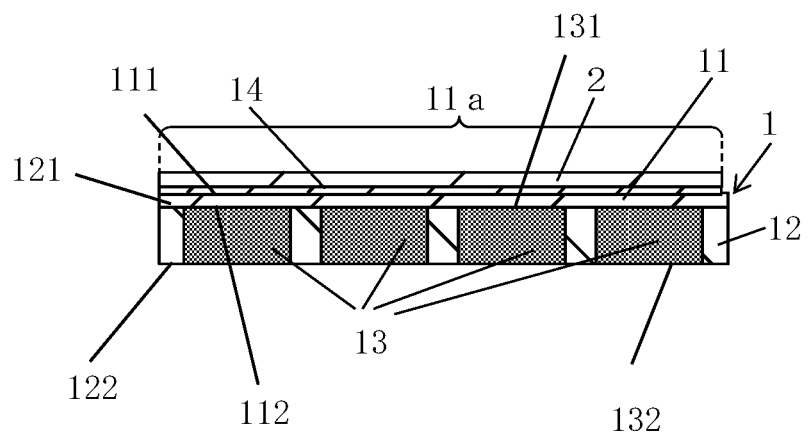
FIG. 19B is a vertical cross-sectional view taken along the line B-B of FIG. 19A.

Also, as in the example illustrated in FIGS. 15A and 15B, with the arrangement in the direction in which the plurality of heat dissipation bodies 13 are aligned (the y direction in FIGS. 15A and 15B) and the arrangement in the direction perpendicular to the direction in which the plurality of heat dissipation bodies 13 are aligned (the x direction in FIGS. 15A and 15B), if the heat dissipation bodies 13 are arranged so as to be displaced in the direction in which the plurality of heat dissipation bodies 13 are aligned, the distance between the electronic elements 2 adjacent to each other in the direction perpendicular to the direction in which the plurality of heat dissipation bodies 13 are aligned is increased and the heat dissipation of the substrate for mounting electronic element 1 is improved. As a result, the distortion of the substrate for mounting electronic element 1 can be suppressed.

In the example illustrated in FIGS. 13 to 15B, the heat dissipation body 13 is arranged in three rows in the direction perpendicular to the direction in which the plurality of heat dissipation bodies 13 are aligned. However, two or four or more rows may be arranged in the direction perpendicular to the direction in which the plurality of heat dissipation bodies 13 are aligned.

Sixth Embodiment

Next, an electronic device according to a sixth embodiment will be described with reference to FIGS. 16A to 19B.

In the substrate for mounting electronic element 1 according to the sixth embodiment, a difference from the substrates for mounting electronic element 1 according to the above-described embodiments is that the plurality of heat dissipation bodies 13 are located in a matrix inside the second substrate 12. In addition, the first surface 111 includes the at least one mounting portion 11a for the electronic element 2 which is a longitudinal region, and the one mounting portion 11a is provided in the examples illustrated in FIGS. 16A to 20B. The one mounting portion 11a has a rectangular shape in which one end in the longitudinal direction is located at the outer edge of the first surface 111.

In the examples illustrated in FIGS. 16A to 19B, the substrate for mounting electronic element 1 includes the twelve heat dissipation bodies 13 in a transparent plan view. With respect to the arrangement of the twelve heat dissipation bodies 13, four heat dissipation bodies are arranged side by side in terms of the longitudinal direction (the y direction in FIGS. 16A to 19B) of the mounting portion 11a, and three heat dissipation bodies are arranged side by side in terms of the direction perpendicular to the longitudinal direction (the x direction in FIGS. 16A to 19B) of the mounting portion 11a.

The through hole 12a of the second substrate 12 has a polygonal shape such as a rectangular shape or a circular shape in a plan view. The through hole 12a has a quadrangular shape in a plan view in the example illustrated in FIGS. 16A to 19B. The second substrate 12 includes the plurality of through holes 12a arranged side by side in a matrix in a plan view. In the example illustrated in FIGS. 16A to 19B, the four through holes 12a are arranged in the longitudinal direction (y direction in FIGS. 16A to 19B) and the three through holes 12a are arranged in the direction (x direction in FIGS. 16A to 19B) perpendicular to the longitudinal direction, and thus the second substrate 12 has the twelve through holes 12a in a plan view in the example illustrated in FIGS. 16A to 19B. Each of the twelve through holes 12a has the heat dissipation body 13a located therein. In addition, in the examples illustrated in FIGS. 16A to 19B, the second substrate 12 includes a plurality of lattice portions located in a matrix in a plan view.

The fifth surfaces 131 of the plurality of heat dissipation bodies 13 are located on the third surface 121 side of the second substrate 12, and the sixth surfaces 132 of the plurality of heat dissipation bodies 13 are located on the fourth surface 122 side. Some of the plurality of heat dissipation bodies 13 are located so as to overlap the mounting portion 11a in a transparent plan view, as in the example illustrated in FIGS. 16A to 19B.

In the example illustrated in FIGS. 16A to 19B, in the substrate for mounting electronic element 1, in a transparent plan view, four heat dissipation bodies are arranged side by side in the longitudinal direction, and three heat dissipation bodies are arranged side by side in the direction perpendicular to the longitudinal direction, and thus a total of the twelve heat dissipation bodies 13 are located in the through holes 12a of the second substrate 12.

The metal layer 14 located on the first surface 111 of the first substrate 11 is used as the mounting portion 11a of the electronic element 2 or a connecting portion of the connecting member 3 such as a bonding wire, and the metal layer 14 is a member for electrically connecting the electronic element 2 and the wiring conductor of the wiring substrate 4.

In a longitudinal cross-sectional view of the at least one mounting portion 11a in the longitudinal direction, if the heat conduction of the plurality of heat dissipation bodies 13 in the thickness direction (the z direction in FIGS. 16A to 19B) is greater than the heat conduction of the plurality of heat dissipation bodies 13 in the direction perpendicular to the thickness direction (the y direction in FIGS. 16A to 19B), the heat transfer to the longitudinal direction of the at least one mounting portion 11a is suppressed, and thus the heat is less likely to stay in the at least one mounting portion 11a. Therefore, it becomes easy to radiate heat to the fourth surface 122 side of the second substrate 12 and the sixth surface 132 side of the plurality of heat dissipation bodies 13. As a result, the distortion of the substrate for mounting electronic element 1 can be suppressed.

Also, in the plurality of heat dissipation bodies 13, the heat conduction in the direction perpendicular to the longitudinal direction (the x direction in FIGS. 16A to 19B) of the at least one mounting portion 11a and the thickness direction (the z direction in FIGS. 16A to 19B) of the plurality of heat dissipation bodies 13 is greater than the heat conduction in the longitudinal direction (they direction in FIGS. 16A to 19B) of the at least one mounting portion 11a. Therefore, it is possible to suppress heat transfer in the longitudinal direction of at least one mounting portion 11a and improve the heat dissipation of the substrate for mounting electronic element 1. As a result, the distortion of the substrate for mounting electronic element 1 can be suppressed.

Further, as seen in a transparent plan view, if the plurality of heat dissipation bodies 13 are located in a matrix inside the second substrate 12, it is possible to suppress heat transfer in the longitudinal direction of the at least one mounting portion 11a and increase the heat transfer in the direction perpendicular to the longitudinal direction of the at least one mounting portion 11a. Therefore, it is possible to restrain heat from staying in the substrate for mounting electronic element 1 and to improve the heat dissipation of the substrate for mounting electronic element 1 so that the distortion of the substrate for mounting electronic element 1 can be suppressed.

In addition, in the plurality of heat dissipation bodies 13, the third surface 121 and the side surfaces are well retained, and thus good heat transfer can be achieved between the first substrate 11 and the plurality of heat dissipation bodies 13 and between the second substrate 12 and the plurality of heat dissipation bodies 13. Therefore, heat dissipation of the substrate for mounting electronic element 1 is improved. As a result, the distortion of the substrate for mounting electronic element 1 can be suppressed.

Further, if the heat conduction of the second substrate 12 is higher than the heat conduction of the first substrate 11 and lower than the heat conduction in the direction perpendicular to the longitudinal direction (the x direction in FIGS. 16A to 19B) of the at least one mounting portion 11a, if the heat generated in the electronic element 2 or the metal layer 14 is transferred toward the second substrate 12 through the first substrate 11, good heat transfer is carried out in the second substrate 12 and this facilitates heat dissipation, and if heat is diffused in the thickness direction of the plurality of heat dissipation bodies 13 to the adjacent heat dissipation bodies 13 via the second substrate 12, heat can be satisfactorily transferred in the direction perpendicular to the longitudinal direction of the at least one mounting portion 11a at the boundary between the second substrate 12 and the heat dissipation body 13. Therefore, even if the electronic element 2 is continuously operated for a long period of time, the heat dissipation of the substrate for mounting electronic element 1 is carried out satisfactorily. As a result, the distortion of the substrate for mounting electronic element 1 can be suppressed and the electronic element 2 can be continuously operated for a long period of time.

Further, if the heat conduction of the second substrate 12 is higher than the heat conduction of the plurality of heat dissipation bodies 13 in the longitudinal direction of the at least one mounting portion 11a and is smaller than the heat conduction of the plurality of heat dissipation bodies 13 in the direction perpendicular to the longitudinal direction of the at least one mounting portion 11a, even if heat is transferred to the adjacent heat dissipation body 13 via the second substrate 12, it is difficult to transfer heat in the longitudinal direction of the at least one mounting portion 11a at the boundary between the second substrate 12 and the heat dissipation body 13 and it is easy to transfer heat in the direction perpendicular to the longitudinal direction of the at least one mounting portion 11a. Therefore, it is possible to restrain the heat transferred from the second substrate 12 from being transferred toward the electronic element 2, and the heat of the second substrate 12 can be satisfactorily transferred to the direction perpendicular to the longitudinal direction of the at least one mounting portion 11a. Thus, even if the electronic element 2 is continuously operated for a long period of time, the heat dissipation of the substrate for mounting electronic element 1 is carried out satisfactorily. As a result, the distortion of the substrate for mounting electronic element 1 can be suppressed and the electronic element 2 can be continuously operated for a long period of time.

Figure 20A:
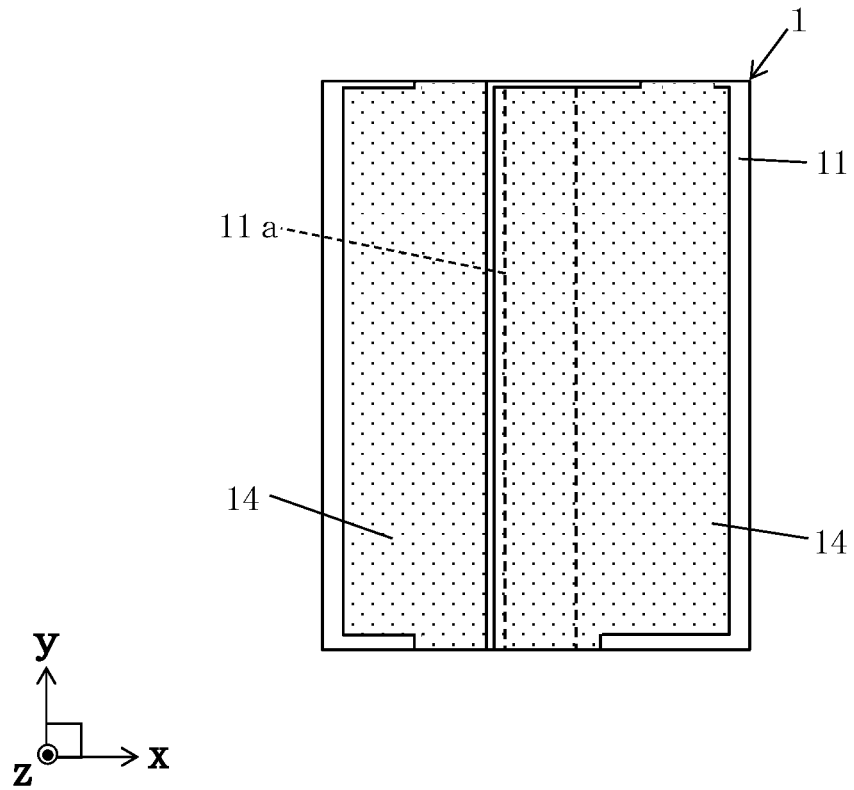
FIG. 20A is a top view illustrating another example of the substrate for mounting electronic element according to the sixth embodiment.
Figure 20B:
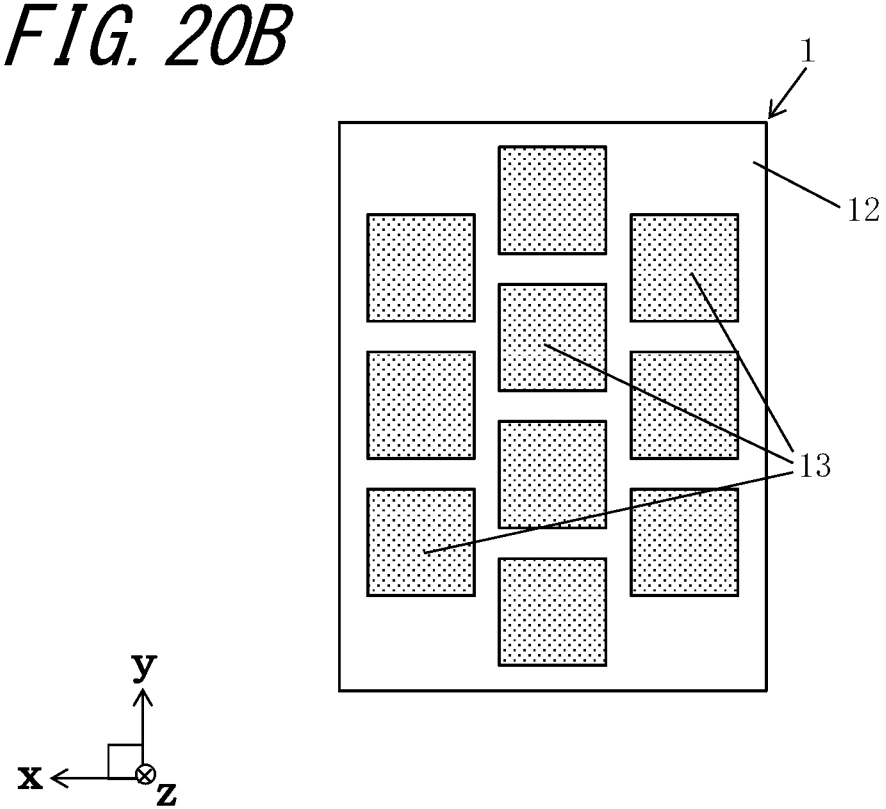
FIG. 20B is a bottom view of FIG. 20A.

Also, as in the example illustrated in FIGS. 20A and 20B, if, with the arrangement in the longitudinal direction (y direction in FIGS. 20A and 20B) of the at least one mounting portion 11a and the arrangement in the direction (x direction in FIGS. 20A and 20B) perpendicular to the longitudinal direction of the at least one mounting portion 11a, the heat dissipation body 13 is arranged to be displaced in the longitudinal direction of the at least one mounting portion 11a, in any region of the mounting portions 11a, the heat dissipation body 13 is located in a direction perpendicular to the longitudinal direction of the at least one mounting portion 11a. Therefore, by eliminating the region where the heat dissipation body 13 is not located in the direction perpendicular to the longitudinal direction of the at least one mounting portion 11a, in each region, the heat dissipation of the substrate for mounting electronic element 1 becomes good, and thus the distortion of the substrate for mounting electronic element 1 can be suppressed.

The substrate for mounting electronic element 1 according to the sixth embodiment can be manufactured by using the same manufacturing method as those of the substrates for mounting electronic element 1 according to the above embodiments.

Seventh Embodiment

Next, a substrate for mounting electronic element according to a seventh embodiment will be described with reference to FIGS. 21 to 22B.

In the substrate for mounting electronic element 1 according to the seventh embodiment, a difference from the substrate for mounting electronic element 1 according to the sixth embodiment described above is that the third substrate 16 is located on the fourth surface 122 of the second substrate 12 and the sixth surfaces 132 of the plurality of heat dissipation bodies 13. That is, the heat dissipation body 13 located in the through hole 12a of the second substrate 12 is covered with the first substrate 11, the third substrate 16, and the second substrate 12 so as not to be exposed.

Figure 21:
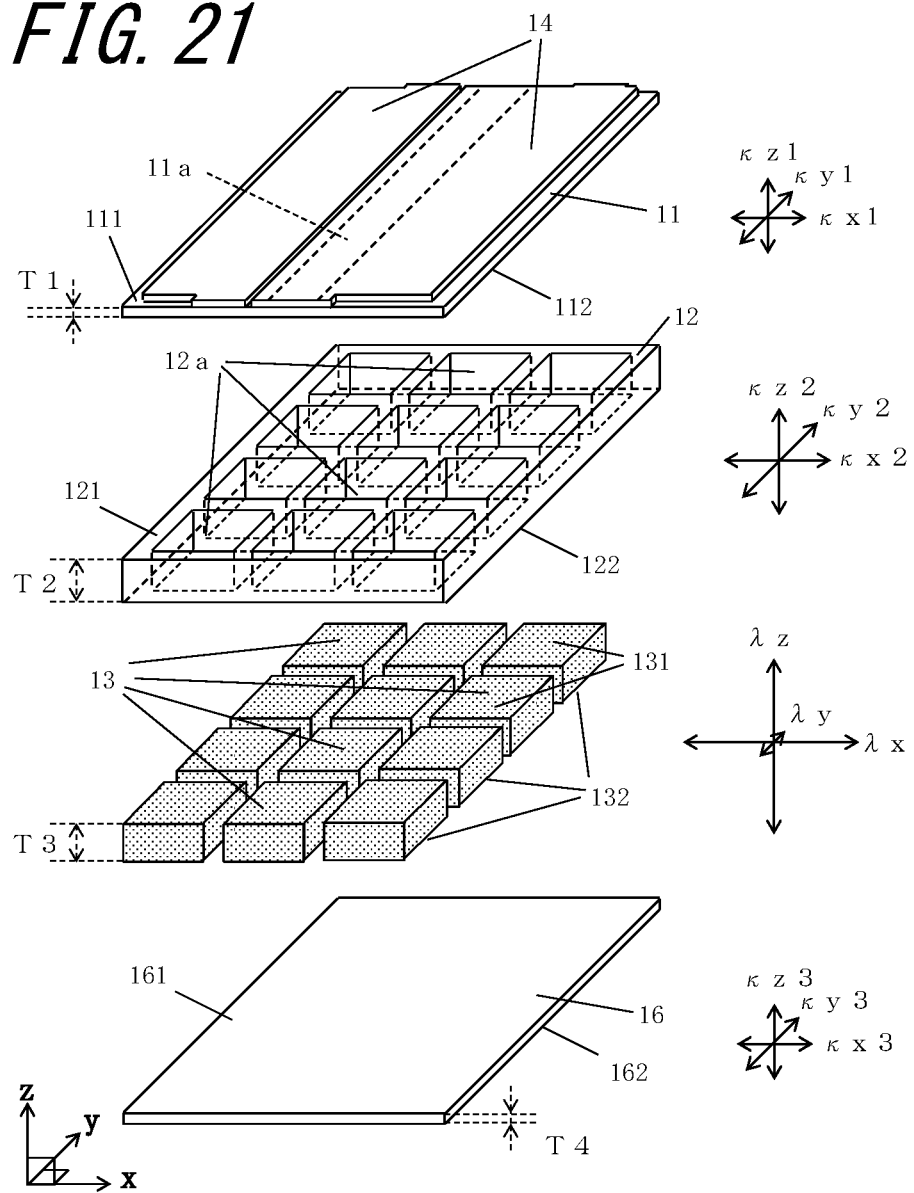
FIG. 21 is an exploded perspective view of a first substrate, a second substrate, and a heat dissipation body of a substrate for mounting electronic element according to a seventh embodiment.
Figure 22A:
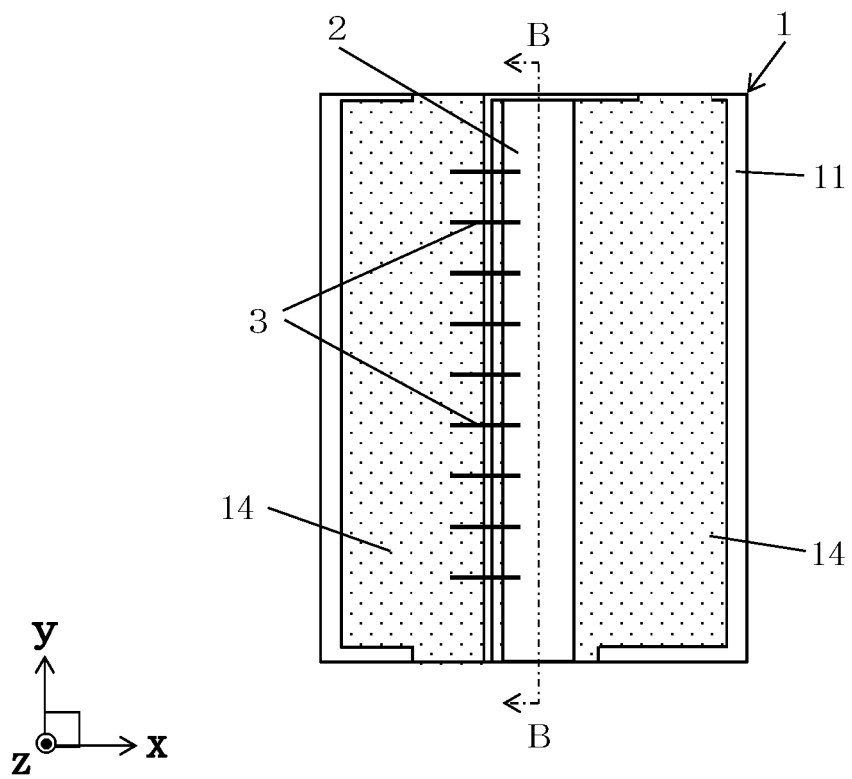
FIG. 22A is a top view illustrating a state in which an electronic element is mounted on the substrate for mounting electronic element according to the seventh embodiment.
Figure 22B:
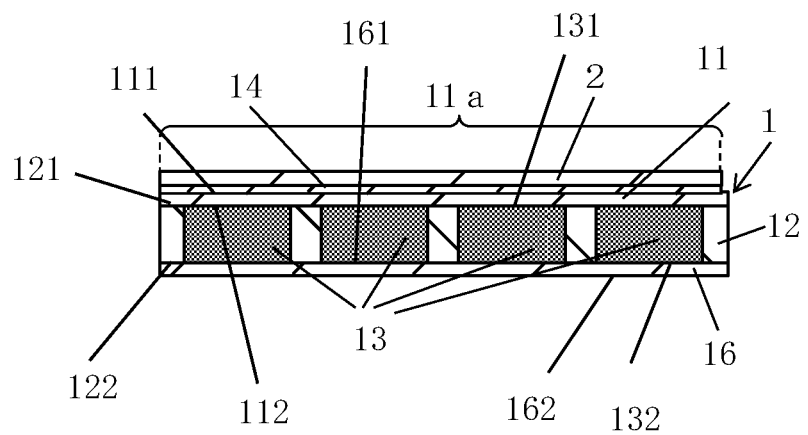
FIG. 22B is a vertical cross-sectional view taken along the line B-B of FIG. 22A.
Figure 22B:
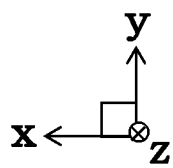

In the example illustrated in FIGS. 21 to 22B, the substrate for mounting electronic element 1 includes the twelve heat dissipation bodies 13 in a transparent plan view. With respect to the arrangement of the twelve heat dissipation bodies 13, four heat dissipation bodies are arranged side by side in terms of the longitudinal direction (the y direction in FIGS. 21 to 22B), and three heat dissipation bodies are arranged side by side in terms of the direction perpendicular to the longitudinal direction (the x direction in FIGS. 21 to 22B).

The plurality of heat dissipation bodies 13 are shaded in the example illustrated in FIG. 21. The metal layer 14 is shaded in the example illustrated in FIGS. 22A and 22B. In the example illustrated in FIGS. 22A and 22B, in the second substrate 12, the outer surface of the second substrate 12 and the inner surface of the through hole 12a which are invisible in a perspective view are shown by broken lines. Further, the mounting portion 11a of the electronic element 2 is arranged so as to overlap with some of the plurality of heat dissipation bodies 13 in a transparent plan view.

The third substrate 16 includes a seventh surface 161 (an upper surface in FIGS. 21 to 22B) facing the fourth surface 122 of the second substrate 12 and the sixth surfaces 132 of the plurality of heat dissipation bodies 13 and an eighth surface 162 (a lower surface in FIGS. 21 to 22B) opposite to the seventh surface 161. Therefore, the distortion of the substrate for mounting electronic element 1 due to the difference in thermal expansion between the first substrate 11 and the second substrate 12 and the plurality of heat dissipation bodies 13 is suppressed, and thus the electronic element 2 can be operated for a long period of time while suppressing the displacement of the electronic element 2 or the distortion of the substrate for mounting electronic element 1. The third substrate 16 has a rectangular plate-like shape including two sets of opposing sides (four sides) with respect to each of the seventh surface 161 and the eighth surface 162 in a plan view.

The third substrate 16 can be manufactured by using the same material and method as those of the first substrate 11 described above. As in the example illustrated in FIG. 21, as in the case of the first substrate 11, the thermal conductivity $\kappa\gamma$ of the third substrate 16 is substantially constant in the x direction and the y direction in the planar direction, and the thermal conductivity in the z direction which is the thickness direction of the third substrate 16 is also the same as the thermal conductivity in the x direction and the y direction in the planar direction ($\kappa\gamma x \approx \kappa\gamma y \approx \kappa\gamma z$). For example, if an aluminum nitride sintered body is used as the third substrate 16, as the third substrate 16, a substrate having a thermal conductivity $\kappa\gamma$ of about 100 to 200 W/m·K is used.

In the substrate for mounting electronic element 1 according to the seventh embodiment, the second surface 112 of the first substrate 11, the third surface 121 of the second substrate 12, and the fifth surfaces 131 of the plurality of heat dissipation bodies 13 are joined by a bonding material such as an active brazing material made of TiCuAg alloy, TiSnAgCu alloy, or the like. The seventh surface 161 of the third substrate 16, the fourth surface 122 of the second substrate 12, and the sixth surfaces 132 of the plurality of heat dissipation bodies 13 are joined by a bonding material such as an active brazing material made of TiCuAg alloy, TiSnAgCu alloy, or the like.

Also in the substrate for mounting electronic element 1 according to the seventh embodiment, similar to the above-described embodiments, the first substrate 11, the second substrate 12, the plurality of heat dissipation bodies 13, and the third substrate 16 have a quadrangular shape in a plan view. A quadrangular composite substrate is formed by bonding the first substrate 11, the second substrate 12, the plurality of heat dissipation bodies 13, and the third substrate 16 to each other. In the example illustrated in FIGS. 21 to 22B the first substrate 11, the second substrate 12, and the third substrate 16 have a rectangular shape, and thus a rectangular composite substrate is formed.

The first substrate 11, the second substrate 12, the plurality of heat dissipation bodies 13, and the third substrates 16 may be joined at the same time. For example, the heat dissipation body 13 may be located in the through hole 12a of the second substrate 12, and the first substrate 11 and the third substrate 16 may be joined to the second substrate 12 and the plurality of heat dissipation bodies 13 to form the same. In this case, for example, by bonding while applying pressure from the first surface 111 side of the first substrate 11 and the eighth surface 162 side of the third substrate 16, the first substrate 11, the second substrate 12, the plurality of heat dissipation bodies 13, and the third substrate 16 are well joined to each other, and thus the substrate for mounting electronic element 1 having excellent reliability can be obtained. Also, by bonding the first substrate 11, the second substrate 12, the plurality of heat dissipation bodies 13, and the third substrate 16 at the same time, it is possible to suppress the exposure of the plurality of heat dissipation bodies 13 during manufacturing and suppress the deterioration due to the outside air.

Since the second substrate 12 and the plurality of heat dissipation bodies 13 are located between the first substrate 11 and the third substrate 16, the distortion of the substrate for mounting electronic element 1 due to the difference in thermal expansion between the first substrate 11, the second substrate 12 and the plurality of heat dissipation bodies 13 is suppressed. Therefore, by suppressing the displacement of the electronic element 2 or the distortion of the substrate for mounting electronic element 1, the light can be easily emitted favorably.

In particular, if the third substrate 16 uses a substrate of the same material as the first substrate 11, that is, for example, if using an aluminum nitride sintered body with 150 W/m·K as the first substrate 11, if an aluminum nitride sintered body with 150 W/m·K is used as the third substrate 16, the distortion of the substrate for mounting electronic element 1 is more effectively suppressed. As a result, favorable light emission can be facilitated.

The substrate thickness T1 of the first substrate 11 is, for example, about 50 μm to 500 μm, and the substrate thickness T2 of the second substrate 12 is, for example, about 100 μm to 2000 μm. The substrate thickness T3 of the plurality of heat dissipation bodies 13 is, for example, about 100 μm to 2000 μm.

Further, the substrate thickness T4 of the third substrate 16 is, for example, about 50 μm to 500 μm, as similar to the substrate thickness T1 of the first substrate 11. If the substrate thickness T1 of the first substrate 11 and the substrate thickness T4 of the third substrate 16 are located at the same thickness within a range of about 10% ($0.90T1 \leq T4 \leq 1.10T1$), by suppressing the distortion of the substrate for mounting electronic element 1 more effectively, it is possible to easily satisfactorily emit light. For example, if the substrate thickness T1 of the first substrate 11 is 100 μm, the substrate thickness T4 of the third substrate 16 may be 100 μm (90 μm to 110 μm).

The substrate thickness T1 of the first substrate 11 and the substrate thickness T4 of the third substrate 16 may be smaller than the substrate thickness T3 of the plurality of heat dissipation bodies 13 (T3>T1, T3>T4).

In addition, the third substrate 16 may include a bonding layer located on the eighth surface 162 side. The bonding layer located on the third substrate 16 can be used for joining the substrate for mounting electronic element 1 and the conductor layer located on the wiring substrate 4 or the package for housing electronic element 5, for example. The bonding layer can be manufactured by a method similar to that of the metal layer 14 described above. In addition, by placing the bonding layer on substantially the entire lower surface of the third substrate 16 so as to cover the plurality of heat dissipation bodies 13 in a transparent plan view, the heat dissipation from the substrate for mounting electronic element 1 to the wiring substrate 4 or the package for housing electronic element 5 can be improved.

Similar to the metal layer 14, the bonding layer includes a plating layer on the surface thereof.

The substrate for mounting electronic element 1 according to the seventh embodiment can be manufactured by using the same manufacturing method as those of the substrates for mounting electronic element 1 according to the above embodiments.

Eighth Embodiment

Next, an electronic device according to an eighth embodiment will be described with reference to FIGS. 23 to 24B.

Figure 23:
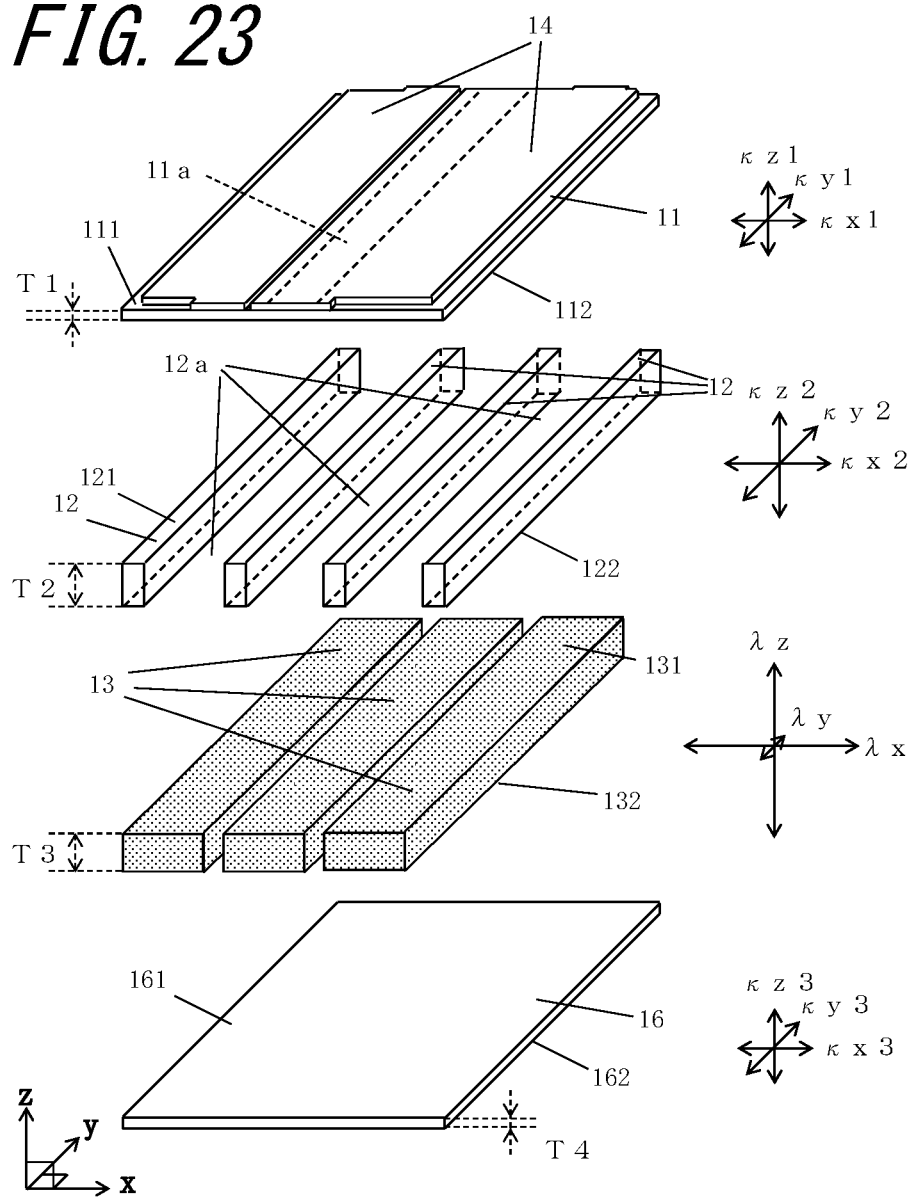
FIG. 23 is an exploded perspective view of a first substrate, a second substrate, and a heat dissipation body of a for mounting electronic element substrate according to an eighth embodiment.
Figure 24A:
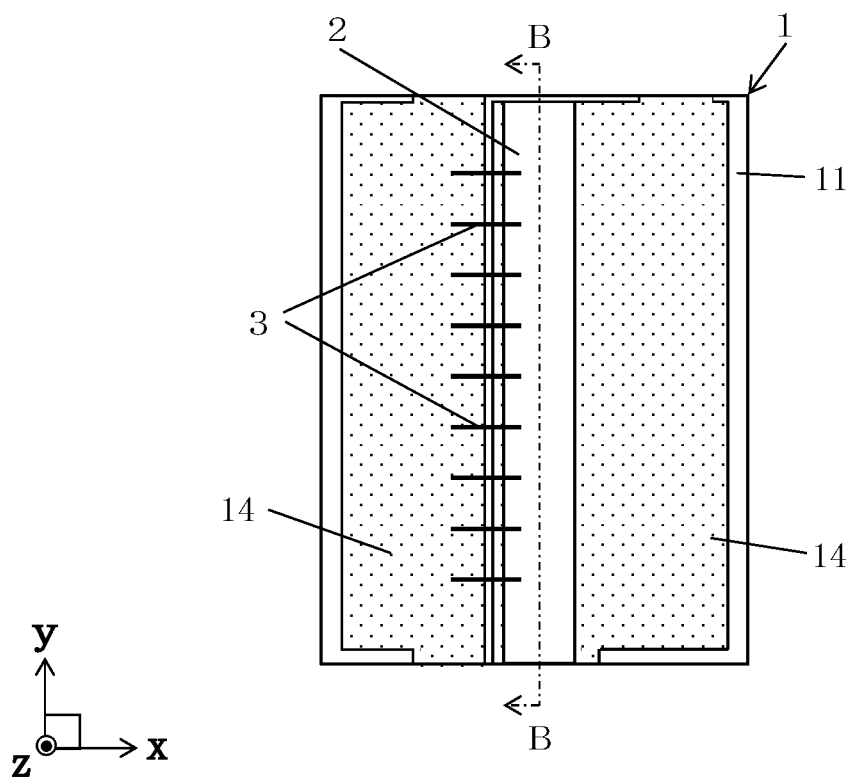
FIG. 24A is a top view illustrating a state in which an electronic element is mounted on the substrate for mounting electronic element according to the eighth embodiment.
Figure 24B:
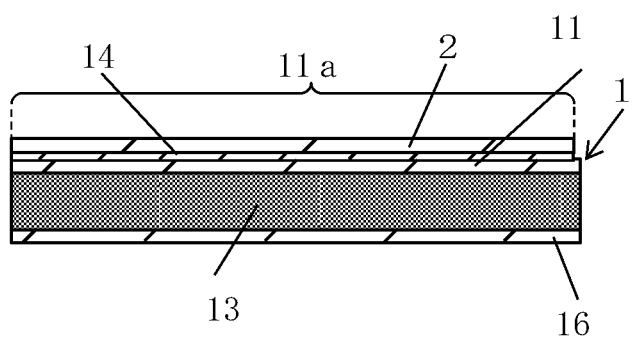
FIG. 24B is a vertical cross-sectional view taken along the line B-B of FIG. 24A.
Figure 24B:
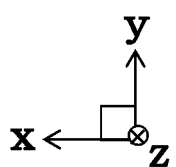

In the substrate for mounting electronic element 1 according to the eighth embodiment, a difference from the substrates for mounting electronic element 1 according to the sixth and seventh embodiments described above is that a plurality of heat dissipation bodies 13 which are long in the longitudinal direction (the y direction in FIGS. 23 to 24B) are arranged in the direction perpendicular to the longitudinal direction (the x direction in FIGS. 23 to 24B).

The plurality of heat dissipation bodies 13 are shaded in the example illustrated in FIG. 23. The metal layer 14 is shaded in the example illustrated in FIGS. 24A and 24B. In the example illustrated in FIG. 23, in the second substrate 12, the outer surface of the second substrate 12 and the inner surface of the through hole 12a, which are invisible in a perspective view, are shown by broken lines. The mounting portion 11a of the electronic element 2 is arranged so as to overlap with some of the plurality of heat dissipation bodies 13 in a transparent plan view.

In the examples shown in FIGS. 23 to 24B, the substrate for mounting electronic element 1 includes the three heat dissipation bodies 13 in a transparent plan view. With respect to the arrangement of the three heat dissipation bodies 13, one heat dissipation body is arranged in terms of the longitudinal direction (the y direction in FIGS. 23 to 24B), and three heat dissipation bodies are arranged side by side in terms of the direction perpendicular to the longitudinal direction (the x direction in FIGS. 23 to 24B).

In the substrate for mounting electronic element 1 according to the eighth embodiment, the mounting portion 11a of the electronic element 2 is located in a region overlapping with one heat dissipation body 13 in a transparent plan view. In this case, the thermal conductivity $\lambda y$ of the plurality of heat dissipation bodies 13 in the longitudinal direction (the y direction in FIGS. 23 to 24B) of the plurality of mounting portions 11a is smaller than the thermal conductivity $\lambda x$ in the direction perpendicular to the longitudinal direction of the mounting portion 11a. ($\lambda x \gg \lambda y$).

Further, in the substrate for mounting electronic element 1 according to the eighth embodiment, if the plurality of heat dissipation bodies 13 are long in the direction crossing the longitudinal direction of the at least one mounting portion 11a, the heat transfer in the direction perpendicular to the longitudinal direction of the mounting portion 11a can be further increased. As a result, the distortion of the substrate for mounting electronic element 1 can be suppressed.

Further, if the plurality of heat dissipation bodies 13 extend in the longitudinal direction of the at least one mounting portion 11a to the side surface of the substrate for mounting electronic element 1 as in the example illustrated in FIGS. 23 to 24B, the heat dissipation of the substrate for mounting electronic element 1 becomes favorable over the length direction (y direction in FIGS. 23 to 24B) of the mounting portion 11a. As a result, the distortion of the substrate for mounting electronic element 1 can be suppressed.

In addition, if a plurality of heat dissipation bodies extend to the side surface of the substrate for mounting electronic element 1 in the direction perpendicular to the longitudinal direction of the at least one mounting portion 11a, the heat dissipation of the substrate for mounting electronic element 1 becomes favorable, and thus the distortion of the substrate for mounting electronic element 1 can be suppressed.

Further, a member having excellent heat conduction may be brought into contact with the exposed side surfaces of the plurality of heat dissipation bodies 13 to enhance heat dissipation.

In the substrate for mounting electronic element 1 according to the eighth embodiment, the substrate thickness T1 of the first substrate 11 and the substrate thickness T4 of the third substrate 16 are, for example, about 50 µm to 500 µm, and the substrate thickness T2 of the second substrate 12 and the substrate thickness T3 of the plurality of heat dissipation bodies 13 are, for example, about 100 µm to 2000 µm.

Further, also in the substrate for mounting electronic element 1 according to the eighth embodiment, if the substrate thickness T1 of the first substrate 11 and the substrate thickness T4 of the third substrate 16 are located at the same thickness within a range of about 10% ($0.90T1 \leq T4 \leq 1.10T1$), by suppressing the distortion of the substrate for mounting electronic element 1 more effectively, it is possible to easily satisfactorily emit light. For example, if the substrate thickness T1 of the first substrate 11 is 100 µm, the substrate thickness T4 of the third substrate 16 may be 100 µm (90 µm to 110 µm).

The substrate for mounting electronic element 1 according to the eighth embodiment can be manufactured by the same method as those of the substrates for mounting electronic element 1 according to the above embodiments.

The disclosure is not limited to the examples of the embodiments described above and various modifications can be made. For example, the metal layer 14 located on the first surface 111 of the first substrate 11 is formed by the thin film method in the above example, but it may be a metal layer using a well-known co-firing method or post-firing method of the related art. If such a metal layer 14 is used, the metal layer 14 is preliminarily located on the first surface 111 of the first substrate 11 before joining the first substrate 11 and the plurality of heat dissipation bodies 13. The method described in the above embodiments may be used in order to improve the flatness of the first substrate 11.

Further, the substrate for mounting electronic element 1 may include a chamfer, a notch, or the like at a corner or a side of the substrate for mounting electronic element 1 in a plan view.

In the substrates for mounting electronic element 1 according to the first embodiment to the eighth embodiment, the first substrate 11 or the third substrate 16 is formed of a single insulating layer. However, the number of insulating layers may be different. For example, in the substrate for mounting electronic element 1 according to the first embodiment, the first substrate 11 may be formed of two or more insulating layers.

In the substrates for mounting electronic element 1 according to the first embodiment to the fifth embodiment, the three heat dissipation bodies 13 are accommodated in the three through holes 12a of the second substrate 12. However, it may be a substrate for mounting electronic element 1 in which four or more through holes 12a and heat dissipation bodies 13 are arranged in a direction in which the plurality of heat dissipation bodies 13 are aligned.

Further, the substrates for mounting electronic element 1 according to the first embodiment to the eighth embodiment may be combined. For example, in the substrate for mounting electronic element 1 according to the first embodiment, the substrates for mounting electronic element 1 according to the third to fifth embodiments, and the like, as similar to the substrate for mounting electronic element 1 according to the second embodiment, the plurality of heat dissipation bodies 13 may be circular in a plan view.

The invention claimed is:

1. A substrate comprising:
    a pair of first members containing carbon, having a structure in which graphenes, comprising six-membered rings that are covalently connected, are stacked, and having a quadrangular prism shape;
    a second member positioned between the pair of first members;
    a third member;
    a plating layer formed on the third member;
    a first surface intersecting a second direction; and
    a second surface opposite the first surface, wherein
        the pair of first members is positioned side by side in a first direction, the first direction intersecting the second direction,
        each first member in the pair of first members and the second member has different thermal conductivity characteristics,
        the thermal conductivity characteristic of the pair of first members is more anisotropic than the thermal conductivity characteristic of the second member,
        in the first direction, the thermal conductivity of the first member is lower than the thermal conductivity of the second member,
        in the second direction, thermal conductivity of the first member is greater than the thermal conductivity of the second member,
        in a cross-sectional view in the first direction, a thickness of the each first member is larger than a thickness of the second member,
        the third member covers a surface of a plate-shaped member unit formed by combining the pair of first members and the second member along a plane intersecting the second direction,
        the first surface includes a region where an electronic element is attached, and
        in the region, a position of the electronic element with respect to the each first member and the second member is fixed via the third member.

2. The substrate according to claim 1, wherein
in a third direction intersecting the first direction and the second direction, the thermal conductivity of the each first member is greater than the thermal conductivity of the second member.

3. The substrate according to claim 2, wherein
in the first direction, a width of the second member is less than a width of the each first member.

4. The substrate according to claim 1, wherein
the pair of first members and the third member has different thermal conductivity characteristics,
the thermal conductivity characteristic of the pair of first members is more anisotropic than the thermal conductivity characteristic of the third member,
in the second direction, the thermal conductivity of the pair of first members is greater than the thermal conductivity of the third member, and
in the first direction, thermal conductivity of the pair of first members is lower than the thermal conductivity of the third member.

5. The substrate according to claim 1, wherein
a material of the third member is different from materials of the pair of first members and the second member.

6. The substrate according to claim 5, wherein
in the second direction, a thickness of the third member is less than a thickness of the each first member.

7. The substrate according to claim 6, wherein
in a third direction intersecting the first direction and the second direction, a dimension of the third member is greater than a dimension of the pair of first members.

8. The substrate according to claim 1, wherein
of the first surface and the second surface, only the first surface includes the region.

9. The substrate according to claim 1, wherein
in the second direction, the region overlaps with the pair of first members.

10. The substrate according to claim 1, wherein
the third member includes the first surface.

11. The substrate according to claim 1, wherein
the first surface and the second surface cover the pair of first members and the second member such that the pair of first members and the second member are not exposed.

* * * * *